(12) United States Patent
Yang et al.

(10) Patent No.: US 7,560,382 B2
(45) Date of Patent: Jul. 14, 2009

(54) EMBEDDED INTERCONNECTS, AND METHODS FOR FORMING SAME

(75) Inventors: Haining Yang, Wappingers Falls, NY (US); Thomas W. Dyer, Pleasant Valley, NY (US)

(73) Assignee: International Business Machines Corporation, Armonk, NY (US)

( * ) Notice: Subject to any disclaimer, the term of this patent is extended or adjusted under 35 U.S.C. 154(b) by 218 days.

(21) Appl. No.: 11/467,712

(22) Filed: Aug. 28, 2006

(65) Prior Publication Data

US 2008/0048297 A1 Feb. 28, 2008

(51) Int. Cl.
*H01L 21/44* (2006.01)

(52) U.S. Cl. ...................................... 438/666

(58) Field of Classification Search ............... 438/599, 438/666, 957, 982; 257/206, 776
See application file for complete search history.

(56) References Cited

U.S. PATENT DOCUMENTS 6,417,549 B1 * 7/2002 Oh ............................ 257/401
6,812,574 B2 * 11/2004 Tomita et al. ............... 257/773
7,365,432 B2 * 4/2008 Liaw ......................... 257/758

* cited by examiner

*Primary Examiner*—Calvin Lee
(74) *Attorney, Agent, or Firm*—Scully, Scott, Murphy & Presser, P.C.; H. Daniel Schnurmann

(57) ABSTRACT

The present invention relates to a semiconductor device comprising first and second active device regions that are located in a semiconductor substrate and are isolated from each other by an isolation region therebetween, while the semiconductor device comprises a first conductive interconnect structure that is embedded in the isolation region and connects the first active device region with the second active device region. The semiconductor device preferably contains at least one static random access memory (SRAM) cell located in the semiconductor substrate, and the first conductive interconnect structure cross-connects a pull-down transistor of the SRAM cell with a pull-up transistor thereof. The conductive interconnect preferably comprises doped polysilicon and can be formed by processing steps including photolithographic patterning, etching, and polysilicon deposition.

8 Claims, 28 Drawing Sheets

US 7,560,382 B2

EMBEDDED INTERCONNECTS, AND METHODS FOR FORMING SAME

FIELD OF THE INVENTION

This invention relates to semiconductor devices that comprise embedded conductive interconnects. More specifically, the present invention relates to static random access memory (SRAM) cells with conductive interconnects that are embedded in the substrate, as well as methods for fabricating such SRAM cells.

BACKGROUND OF THE INVENTION

A static random access memory (SRAM) is a significant memory device due to its high speed, low power consumption, and simple operation. Unlike a dynamic random access memory (DRAM) cell, the SRAM does not need to regularly refresh the stored data and it has a straightforward design.

Each bit in a typical six-transistor SRAM (6T-SRAM) cell is stored on four transistors, generally referred to as load transistors (or pull-up transistors) and driver transistors (or pull-down transistors), that form a flip-flop circuit containing two cross-coupled inverters. This storage cell has two stable states which are used to denote 0 and 1. Two additional access transistors (or pass-gate transistors) serve to control the access to a storage cell during read and write operations.

FIG. 1A shows a top-down view of an exemplary complementary metal-oxide-semiconductor (CMOS) 6T-SRAM cell underneath the first metal interconnect level (M1). The 6T-SRAM cell contains: (1) four active device regions (i.e., doped-well regions) 112, 114, 116, and 118, and (2) four gate structures 122, 124, 126, and 128, which form 6 typical metal-oxide-semiconductor (MOS) transistors 101-106. Specifically, n-channel pass-gate transistors 101 and 104 and n-channel pull-down transistors 102 and 103 are formed within the n-type active device regions 112 and 114, and p-channel pull-up transistors 105 and 106 are formed within the p-type active device regions 116 and 118. The active device regions 112, 114, 116, and 118 are formed within the same semiconductor substrate, which may preferably be a silicon substrate doped with n-type and p-type impurities in the vicinity of the p-channel transistors and the n-channel transistors, respectively. Gate structures 122 and 126 extend above the active device region 112 to form gates for the pull-down transistor 102 and the pass-gate transistor 101, respectively. Similarly, gate structures 124 and 128 extend above the active device region 114 to form gates for the pull-down transistor 103 and the pass-gate transistor 104, respectively. Further, the gate structures 122 and 124 extend to over the active device regions 116 and 118 to form gates for the pull-up transistors 105 and 106, respectively. Each SRAM cell further contains multiple metal contacts (CAs) for accessing the respective components of the transistors 101-106, as shown in FIG. 1A.

FIG. 1B shows a top-down view of the exemplary the SRAM cell of FIG. 1A at the M1 level, i.e., the first metal interconnect level. The SRAM cell at the M1 level contains multiple external interconnects or nodes (ENs) and internal interconnects or nodes (INs), each of which overlays one or more SRAM metal contacts (CAs) and forms electrical connections with the CAs. For example, the two ENs located at the middle left and right borders of the SRAM cell respectively overlay and form electrical connections with the CAs that overlay the gate structures 126 and 128 of the pass-gate transistors 101 and 104. The six ENs located at the upper and lower borders of the SRAM cell respectively overlay and form electrical connections with the CAs that overlay the source or drain regions of the transistors 101-106. The two INs located in the middle of the SRAM cell respectively cross-connect the pull-down transistors 102 and 103 with the pull-up transistors 105 and 106.

FIG. 1C shows a cross-sectional view of the SRAM cell along line I-I in FIG. 1B. The two ENs, which are located at the M1 level along the middle left and right borders of the SRAM cell, electrically connect the underlying CAs (not shown) at the contact level with metal vias 132 in the first via level (V1), which in turn are electrically connected to metal interconnects (not shown) in upper metal levels (not shown), such as M2, M3, . . . etc., and/or metal vias (not shown) in upper via levels (not shown), such as V2, V3, . . . etc. Each of the two INs, which are located in the M1 level at the middle portions of the SRAM cell, electrically connects one CA with another CA at the contact level. In this manner, the INs cross-connects the pull-down transistors 102 and 103 located at the active device regions 112 and 114 with the respective pull-up transistors 105 and 106 located at the active device regions 116 and 118 in the underlying substrate 110. Note that the surfaces of the active device regions 112, 114, 116 and 118 are silicided, thereby forming respective surface metal silicide layers 112S, 114S, 116S and 118S. The INs extend only along the M1 level and are not connected to any metal vias and/or interconnects in the upper via and/or metal levels. Therefore, the INs are also referred to hereinafter as "local interconnects."

As the 45 nm node and the 32 nm node generations of complementary metal-oxide-semiconductor (CMOS) devices are approached, scaling of the SRAM cells becomes imperative. However, the scaling effort is significantly limited by conventional lithographic printing, which has been used for patterning the metal contacts and the metal interconnects of the SRAM cells. Due to the large number of metal contacts at the CA level and metal interconnects at the M1 level of the SRAM cells, the overlay limits of conventional lithographic printing have already been reached, and it is difficult to scale the SRAM cells to fit the space requirements of the 45 nm node and the 32 nm node generations.

Therefore, there is a need to reduce the number of metal contacts and metal interconnects in the SRAM cells, thus allowing further scaling of the SRAM cells for the 45 nm node and the 32 nm node generations.

SUMMARY OF THE INVENTION

The present invention solves the above-described problems by providing improved SRAM structures, each of which contains two embedded conductive interconnects that replace the four metal contacts at the contact level and the two local interconnects at the M1 level for connecting the pull-down and pull-up transistors. In this manner, the number of metal contacts and metal interconnects in each SRAM cell is significantly reduced, and further scaling of the SRAM layout can be achieved.

In one aspect, the present invention relates to a semiconductor device comprising at least one SRAM cell located in a semiconductor substrate, wherein the SRAM cell comprises a first conductive interconnect structure that is embedded in the semiconductor substrate and cross-connects a first pull-down transistor of the SRAM cell with a second pull-up transistor thereof.

The first conductive interconnect structure may comprises any suitable conductive materials, such as doped polysilicon, SiGe, NiSi, TaN, and mixtures thereof. Preferably, but not necessarily, the first conductive interconnect structure comprises doped polysilicon. More preferably, the first conductive interconnect structure is L-shaped.

The SRAM cell as described hereinabove may further comprise a second pull-down transistor, a second pull-up transistor, and a second conductive interconnect structures that respectively cross-connect the second pull-down transistor with the second pull-up transistor. A contact level and a first metal interconnect level can be provided over the semiconductor substrate, while the first metal interconnect level, unlike the M1 level in the prior art SRAM cell illustrated hereinabove, does not contact any local interconnect for cross-connecting the first or second pull-down transistor with the first or second pull-up transistor of the SRAM cell.

In another, broader aspect, the present invention relates to a semiconductor device comprising first and second active device regions that are located in a semiconductor substrate and are isolated from each other by an isolation region therebetween, wherein the semiconductor device comprises a first conductive interconnect structure that is embedded in the isolation region and connects the first active device region with the second active device region.

Preferably, but not necessarily, the first conductive interconnect structure comprises doped polysilicon and is L-shaped. Further, the semiconductor device may comprise additional device regions that are located in the semiconductor substrate and are isolated from each other by additional isolation region(s) therebetween, with additional conductive interconnect structure(s) embedded in the additional isolation region(s) and connecting the additional active device regions with one another.

In a further aspect, the present invention relates to a method for forming a semiconductor device, comprising:

forming first and second active device regions in a semiconductor substrate, wherein the first and second active device regions are isolated from each other by an isolation region therebetween; and forming a first conductive interconnect structure that is embedded in the semiconductor substrate to connect the first and second active device regions.

Preferably, but not necessarily, the semiconductor device as mentioned hereinabove is a SRAM cell having a first pull-down transistor formed in the first active device region and a first pull-up transistor formed in the second active device region, and the first pull-down transistor and the first pull-up transistor are cross-connected by the first conductive interconnect structure. More preferably, the SRAM cell further comprises a second pull-down transistor formed in a third active device region in the semiconductor substrate and a second pull-up transistor formed in a fourth active device region in the semiconductor substrate, and a second conductive interconnect structure cross-connects the second pull-down transistor with the second pull-up transistor.

In a particularly preferred, but not necessary, embodiment of the present invention, the first and second conductive interconnect structures comprise doped polysilicon and are formed by processing steps including photolithographic patterning, etching, and polysilicon deposition.

Other aspects, features and advantages of the invention will be more fully apparent from the ensuing disclosure and appended claims.

DETAILED DESCRIPTION OF THE INVENTION, AND PREFERRED EMBODIMENTS THEREOF

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

As mentioned hereinabove, the present invention provides an improved SRAM cell structure that comprises one or more embedded conductive interconnects that cross-connect the pull-down and pull-up transistors in the SRAM cell, thereby eliminating four metal contacts at the contact level and two local interconnects at the M1 level and significantly reducing the total number of metal contacts and metal interconnects in each SRAM cell.

The improved SRAM cell structure as described hereinabove can be formed by exemplary processing steps, as illustrated by FIGS. 2-23B.

Figure 1A:
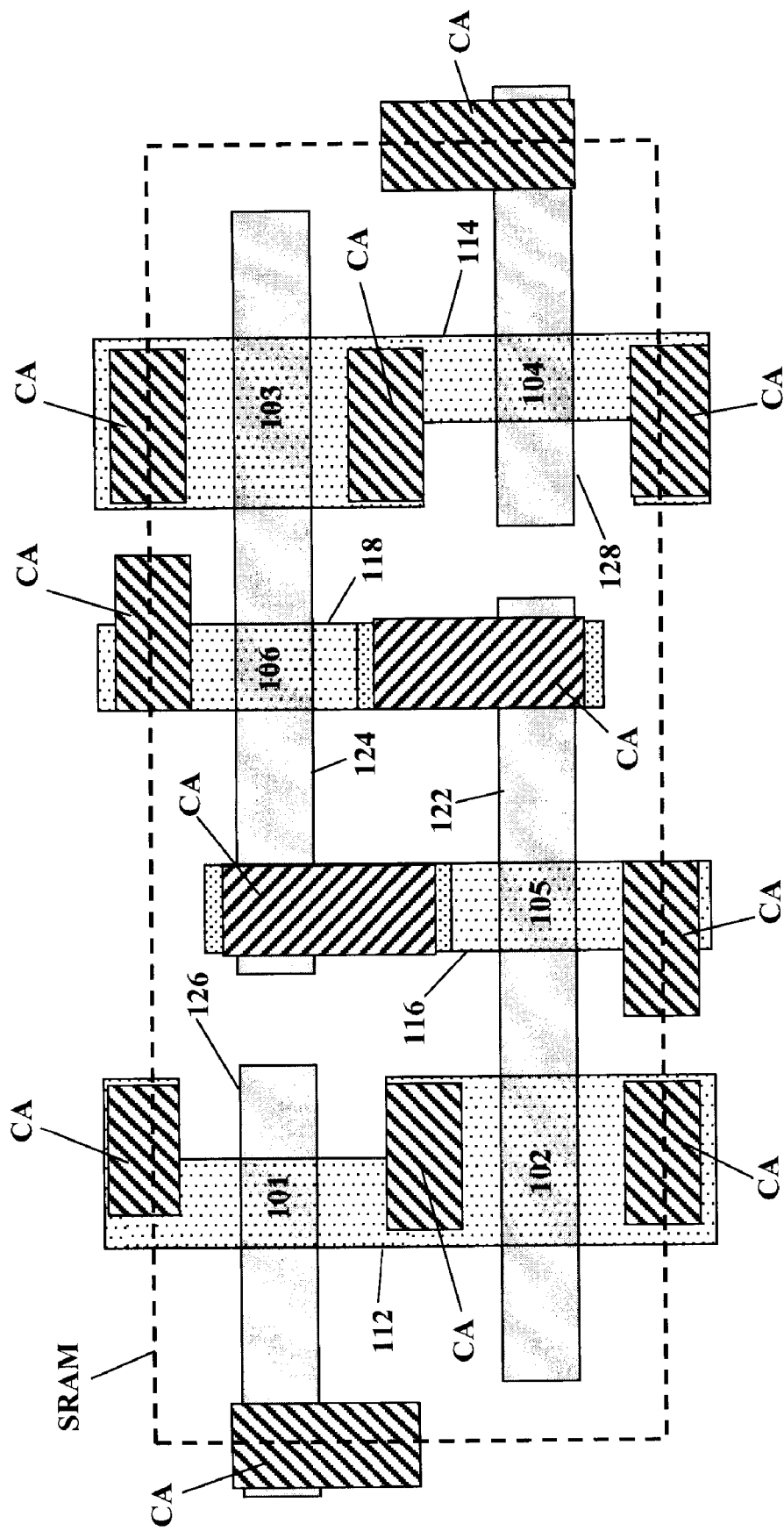
FIG. 1A shows a top view of a conventional 6T-SRAM cell underneath the M1 level.
Figure 1B:
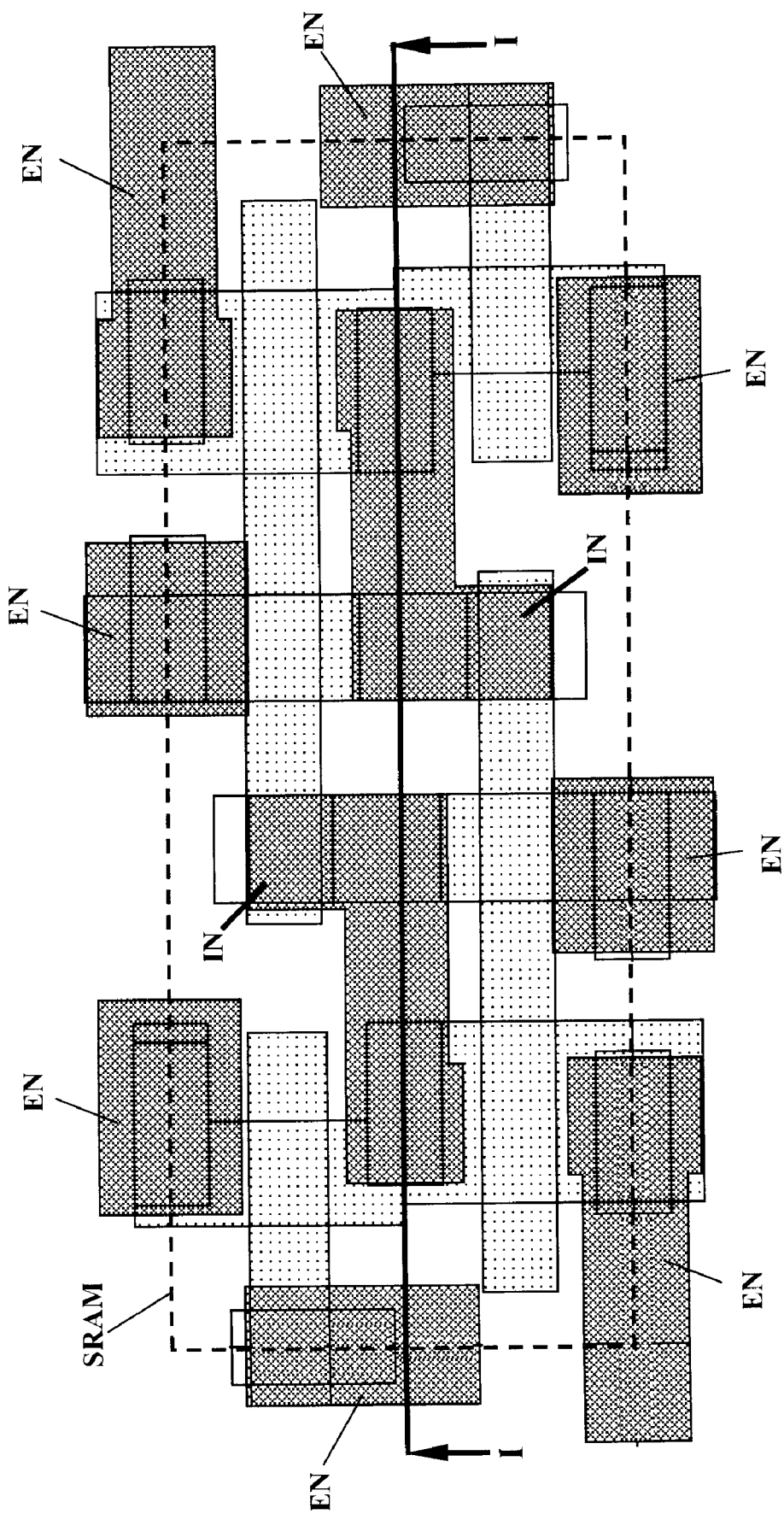
FIG. 1B shows a top view of the conventional 6T-SRAM cell of FIG. 1B at the M1 level.
Figure 1C:
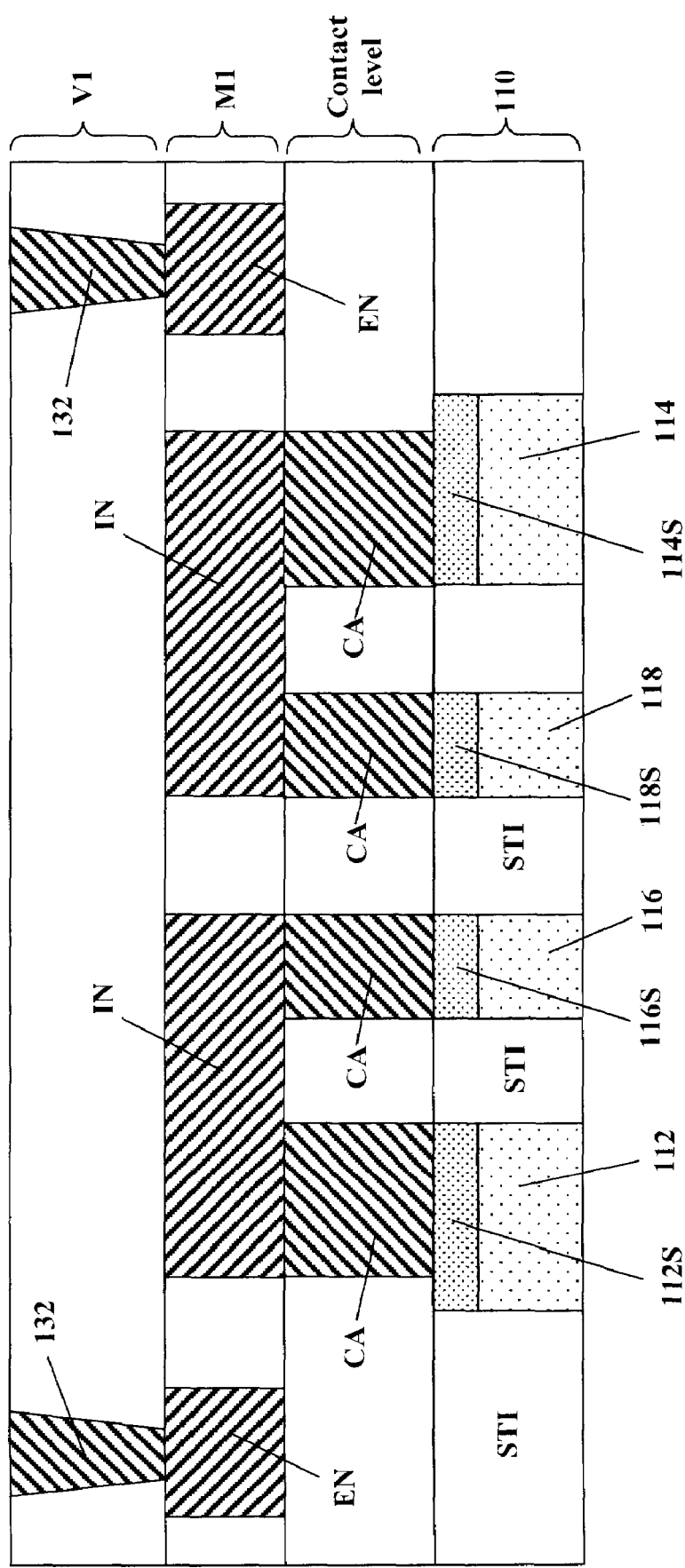
FIG. 1C shows a cross-sectional view of the convention 6T-SRAM cell of FIGS. 1A-1B through the line I-I in FIG. 1B.
Figure 2:
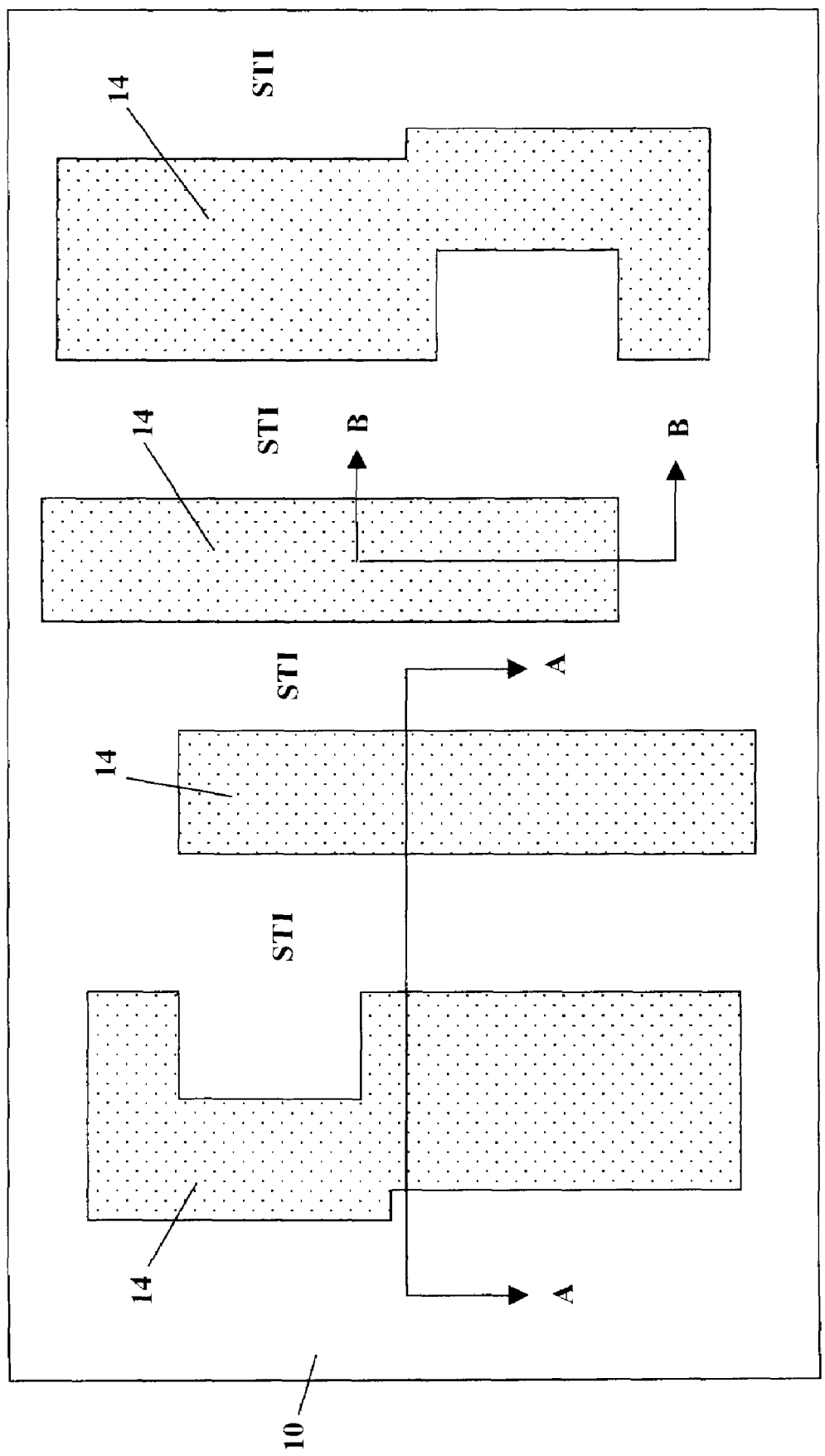
FIGS. 2-23B are top or cross-section views that illustrate exemplary processing steps for forming an improved SRAM cell with embedded polysilicon interconnect structures for cross-connecting pull-down transistors and pull-up transistors in the SRAM cell, according to one embodiment of the present invention.
Figure 3A:
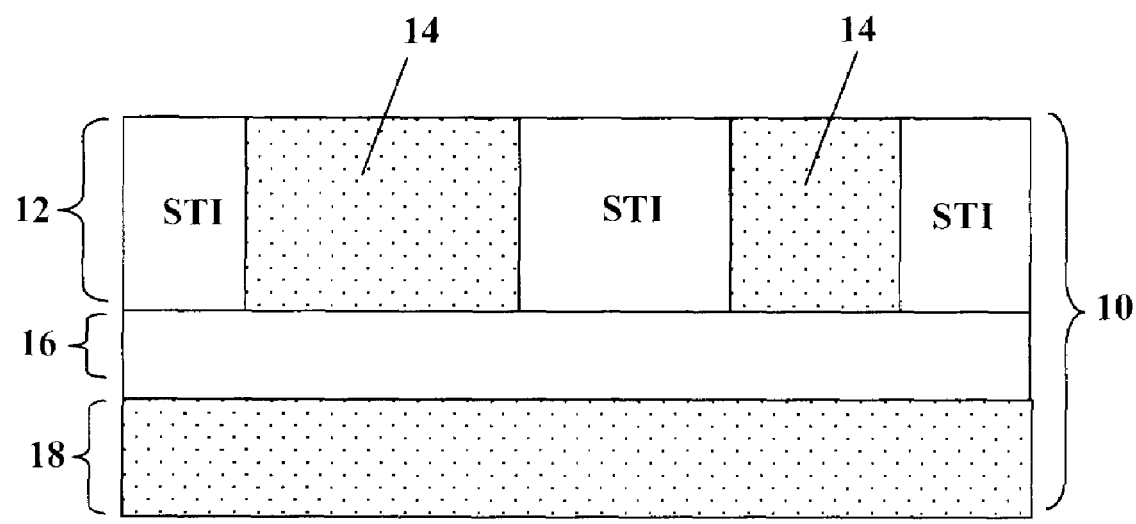
Figure 3B:
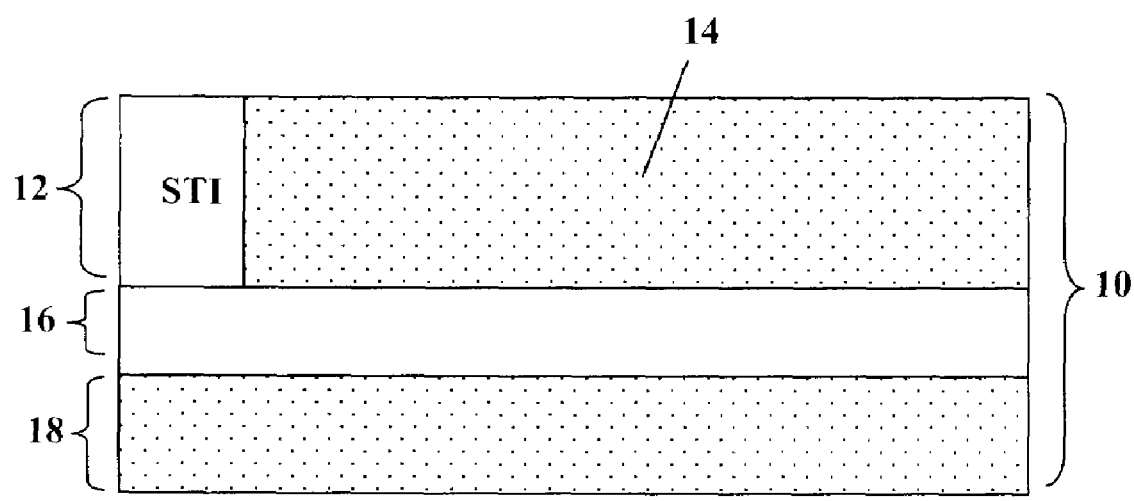

First, FIG. 2 shows a top view of a semiconductor substrate 10, which comprises four active device regions 14 that are isolated from one another by isolation regions therebetween. The isolation regions are designated as STI in the drawings of the present invention. FIGS. 3A and 3B show the cross-sectional view of the device structure of FIG. 2 respectively along the lines A-A and B-B.

The semiconductor substrate 10 may comprise any semiconductor material, which includes, but is not limited to: Si, SiGe, graded SiGe, Ge, Ge alloys, Si:C, SiGe:C, GaAs, InAs, InP, as well as other III-V or II-VI compound semiconductors. The semiconductor substrate 10 may also comprise an organic semiconductor or a layered semiconductor such as Si/SiGe, a semiconductor-on-insulator (SOI) or a SiGe-oninsulator (SGOI). Preferably, the semiconductor substrate 10 is composed of a Si-containing semiconductor material, i.e., a semiconductor material that includes silicon. In the specific embodiment shown in FIGS. 3A and 3B, the semiconductor substrate 10 has a SOI configuration and comprises, from top to bottom, a semiconductor device layer 12, a buried insulator layer 16, and a base semiconductor substrate layer 18. Alternatively, the semiconductor substrate 10 may consists essentially of bulk semiconductor.

Isolation regions are provided in the semiconductor substrate 10 to separate the active device regions 14 from one another. The isolation regions may be either trench isolation regions or field oxide isolation regions. In the specific embodiment shown in FIGS. 2 and 3A-3B, the isolation regions are shallow trench isolation regions (STI) that extend through the semiconductor device layer 12 onto the buried insulator layer 16. Such STI regions can be readily formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well. Field oxide isolation regions may be formed utilizing a so-called local oxidation of silicon process. The active device regions 14 may be doped or undoped. In a preferred embodiment of the present invention, the two terminal active device regions 14 are doped with an n-type dopant species in preparation for forming n-channel pull-down transistors and n-channel pass-gate transistors therein, and the two middle active device regions 14 are doped with a p-type dopant species with preparation for forming p-channel pull-up transistors therein.

Figure 4:
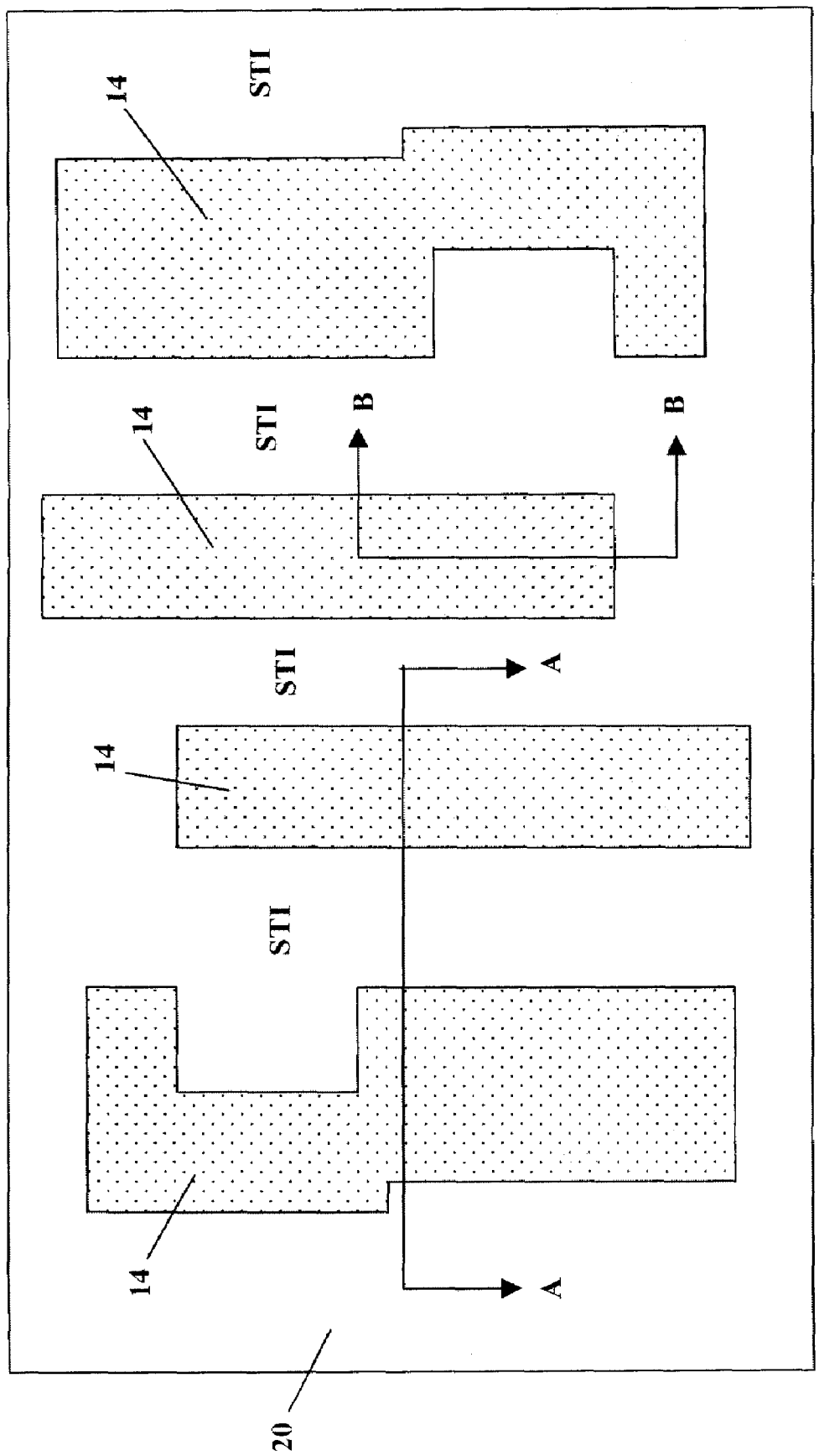
Figure 5A:
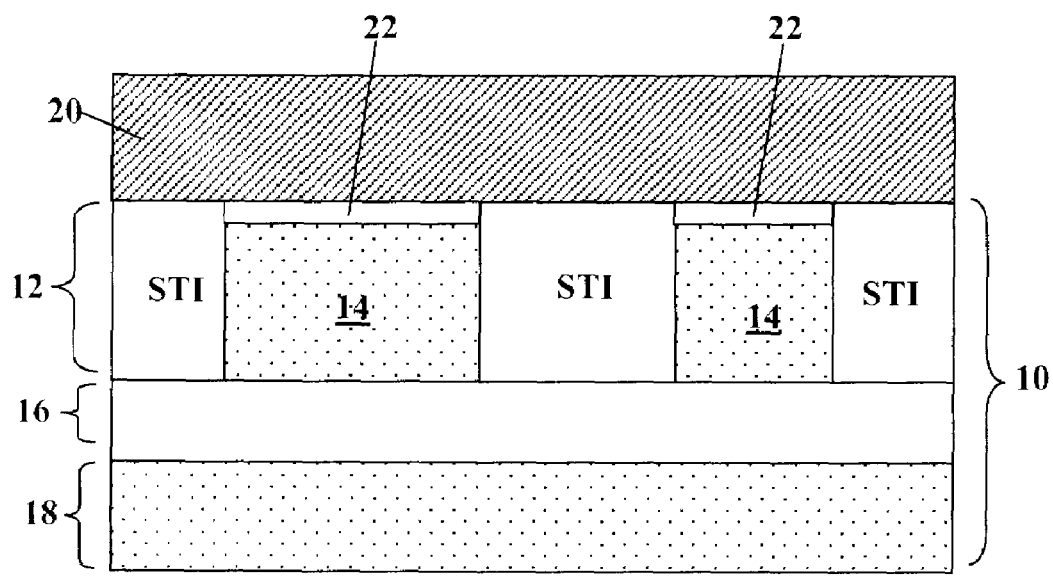
Figure 5B:
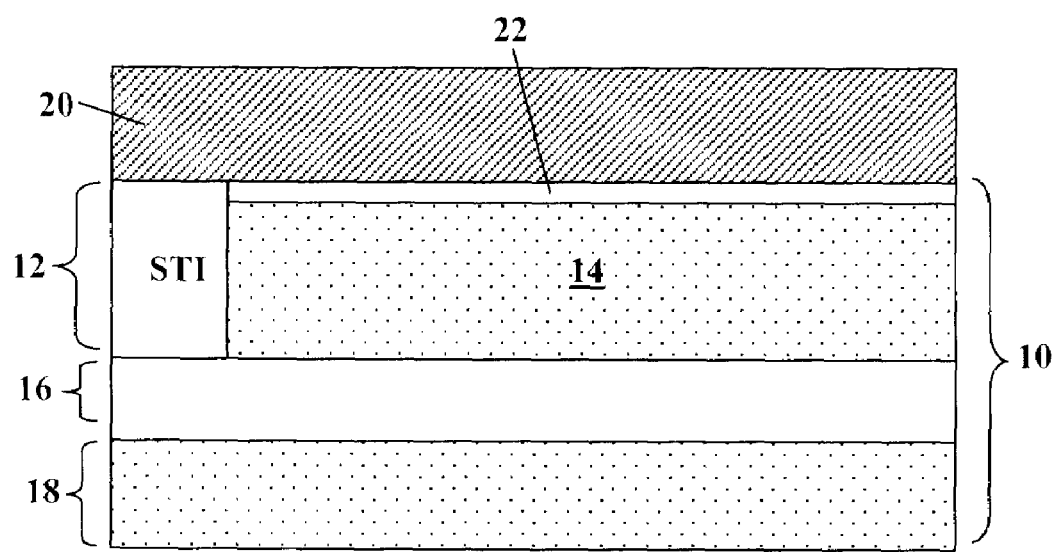

Next, the semiconductor substrate 10 is thermally treated to form a gate insulator layer 22 over surfaces of the active device regions 14, followed by deposition of a blanket gate conductor layer 20, as shown in FIGS. 4 and 5A-5B.

The thermal treatment process can be a thermal oxidation process, a thermal nitrification process, or a thermal oxynitridation process, and the resulting layer 22 can therefore comprise an oxide, a nitride, or an oxynitride. Alternatively, the gate insulator layer 22 can be formed by a deposition process such as, for example, chemical vapor deposition (CVD), plasma-assisted CVD, atomic layer deposition (ALD), evaporation, reactive sputtering, chemical solution deposition and other like deposition processes, and it may comprises a high dielectric constant oxide material, such as, for example, $SiO_2$, $HfO_2$, $ZrO_2$, $Al_2O_3$, $TiO_2$, $La_2O_3$, $SrTiO_3$, $LaTiO_3$, and mixtures thereof. The physical thickness of the gate insulator layer 22 may vary widely, depending on the specific deposition technique employed. Typically, the gate insulator layer 22 has a thickness from about 0.5 to about 10 nm, with a thickness from about 1 to about 5 nm being more typical.

The gate conductor layer 20 may comprise any suitable conductive material, such as doped semiconductors, metals, metal alloys, metal silicides, metal nitrides, etc. Preferably, but not necessarily, the gate conductor layer 20 comprises doped polysilicon.

Figure 6A:
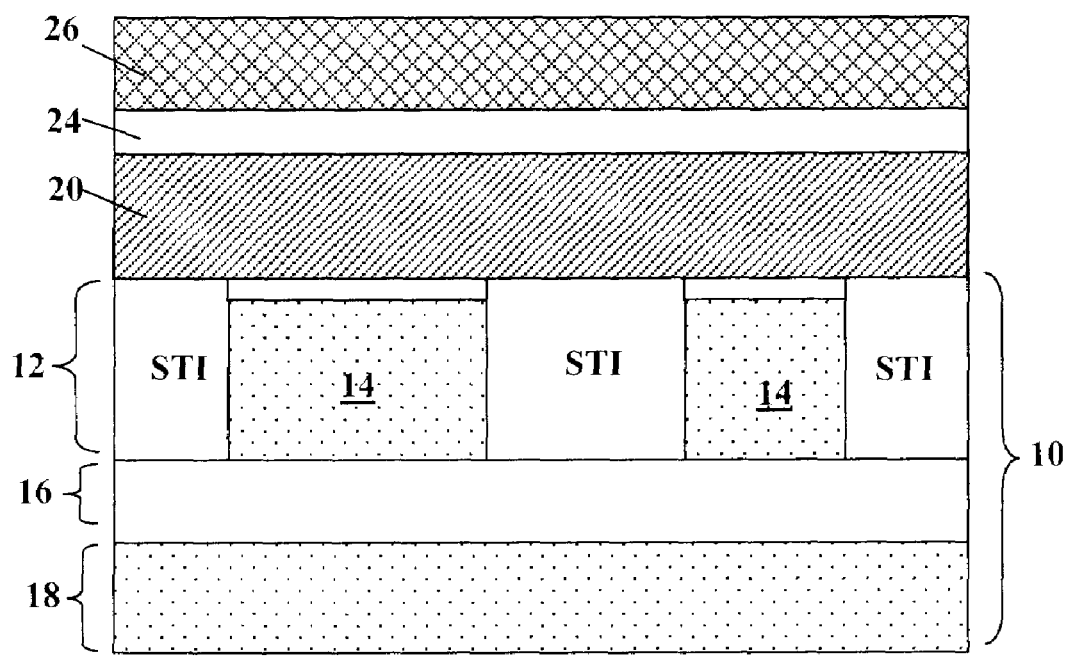
Figure 6B:
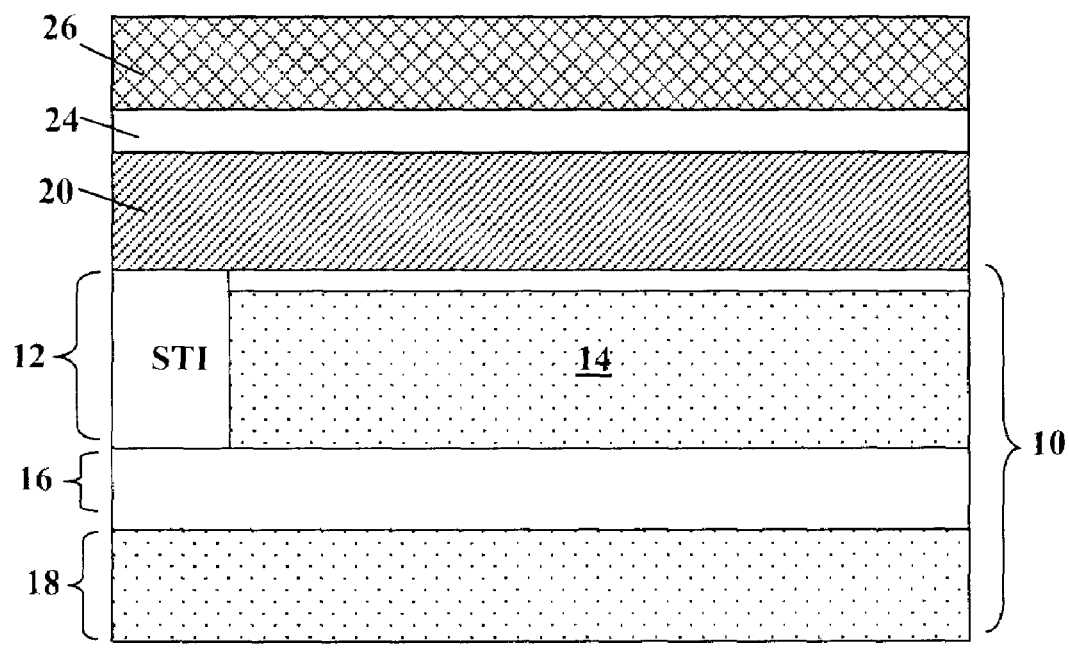
Figure 7:
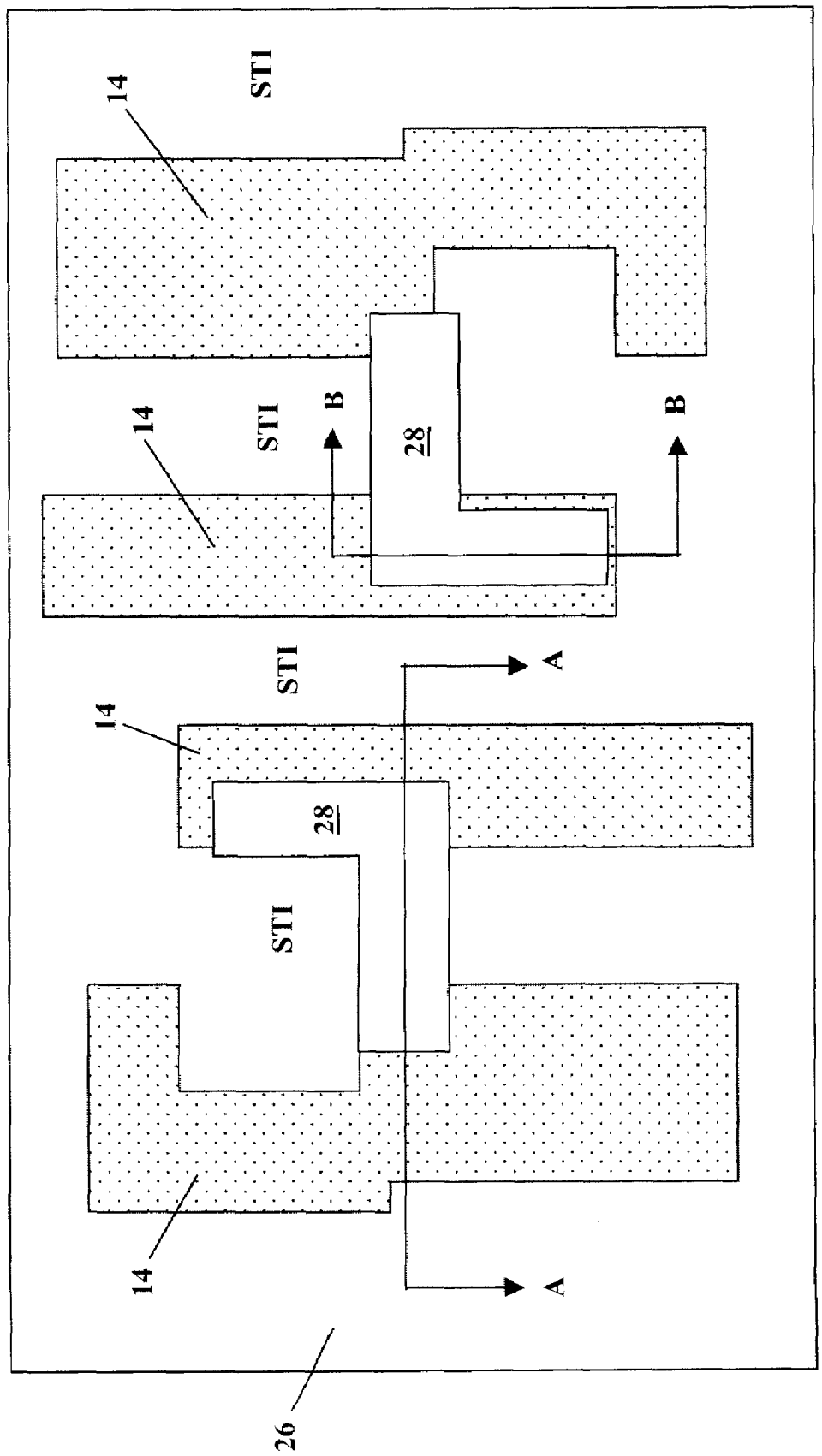
Figure 8A:
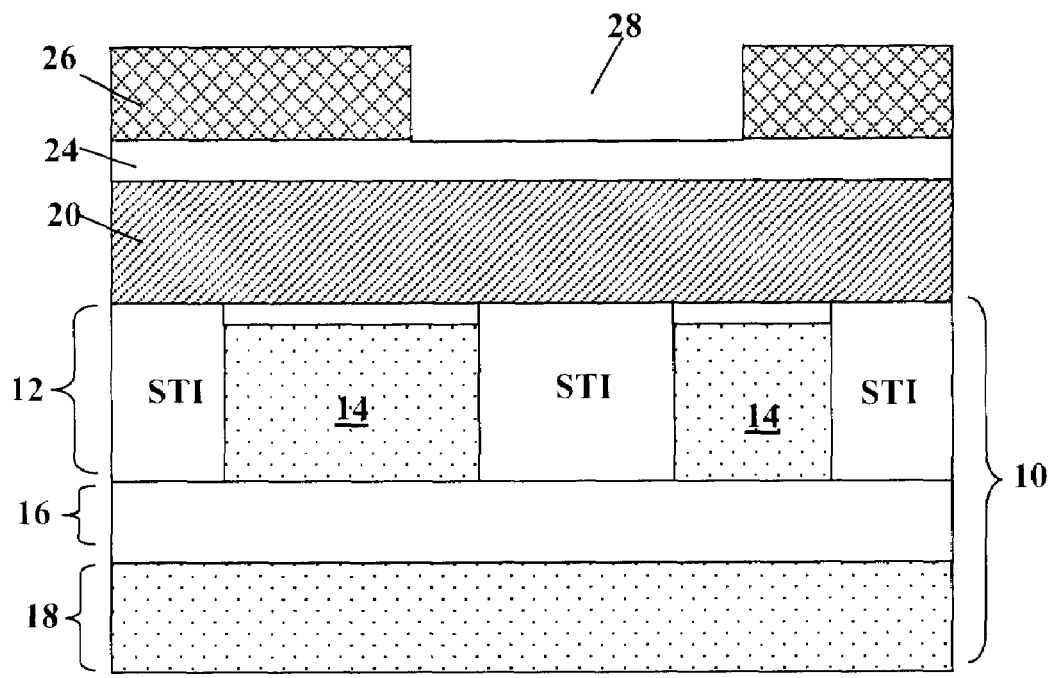
Figure 8B:
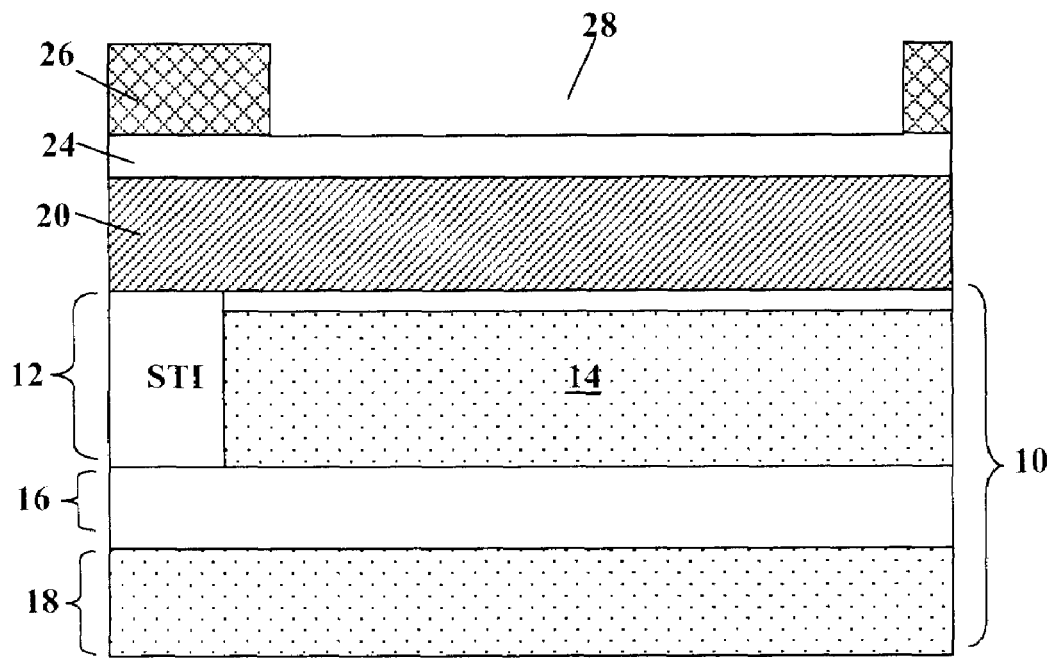

Subsequently, a blanket dielectric hard mask layer 24 and a blanket photoresist layer 26 are deposited over the entire structure, as shown in FIGS. 6A and 6B, followed by lithographic patterning of the blanket photoresist layer 26 to form two L-shaped openings 28 therein, as shown in FIGS. 7 and 8A-8B. The first L-shaped opening 28 located at the left hand side overlays the two active regions 14 at the left, and the second L-shaped opening 28 located at the right hand side overlays the two active regions 14 at the right, as shown in FIG. 7.

Figure 9A:
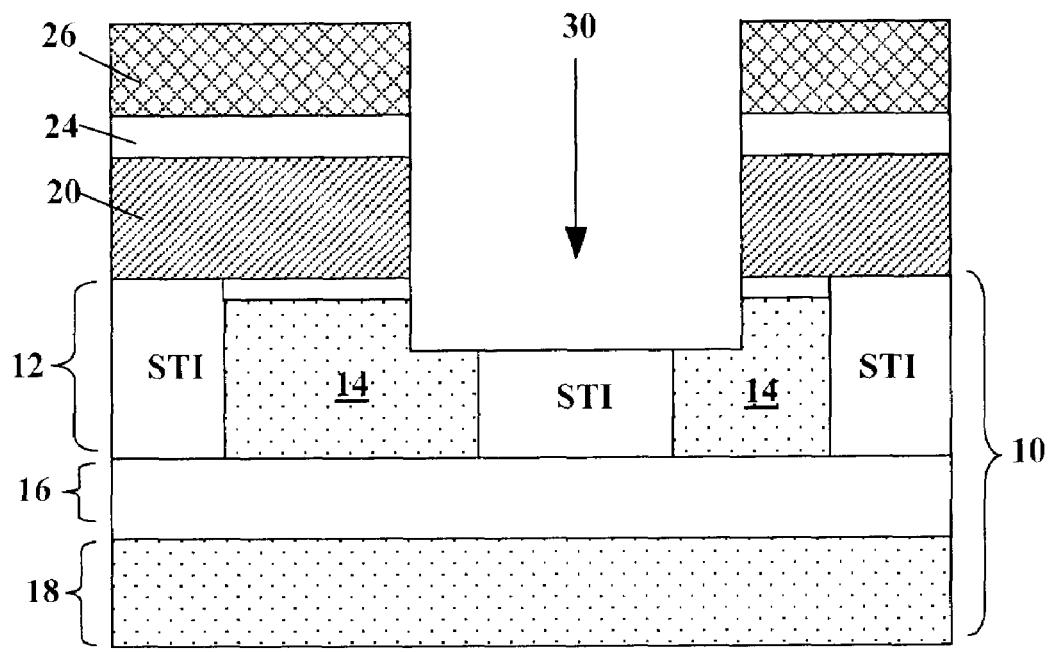
Figure 9B:
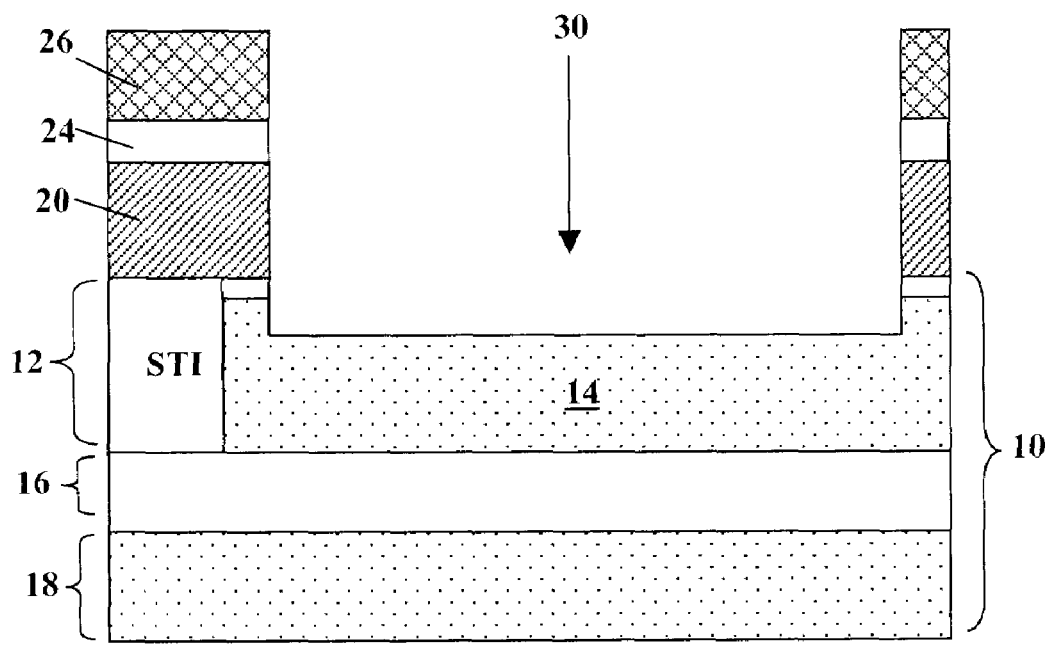

The pattern in the photoresist layer 26 is then transferred to the underlying layers utilizing one or more dry etching steps, thereby forming trenches 30 that extend from the photoresist layer 26 to the dielectric hard mask layer 24, the gate conductor layer 20, the gate insulator layer 22, and into the semiconductor substrate 10, as shown in FIGS. 9A-9B. Suitable dry etching processes that can be used in the present invention include, but are not limited to: reactive ion etching (RIE), ion beam etching, plasma etching or laser ablation. The dry etching is preferably carried out by one or more RIE steps.

Figure 10:
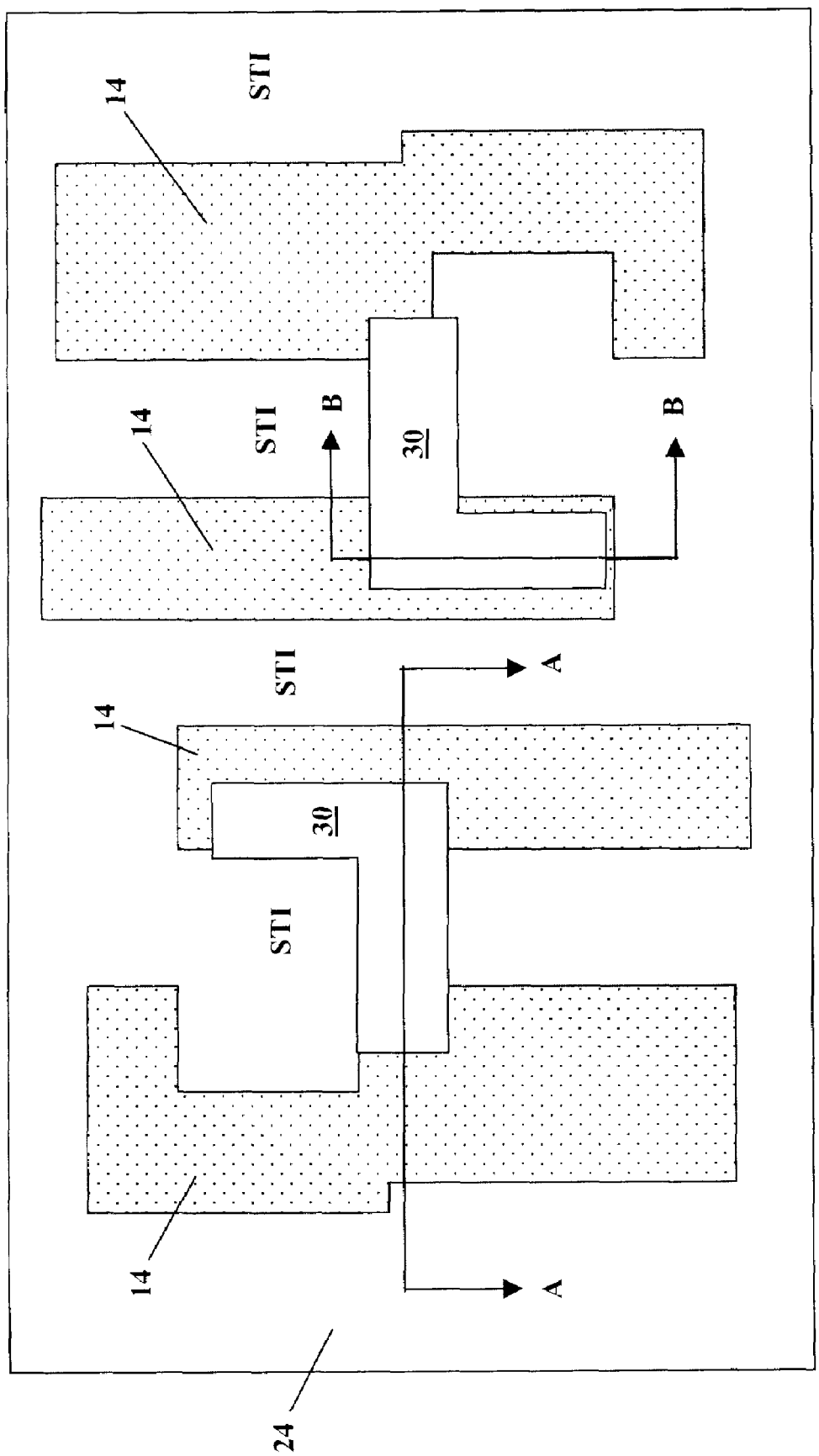
Figure 11A:
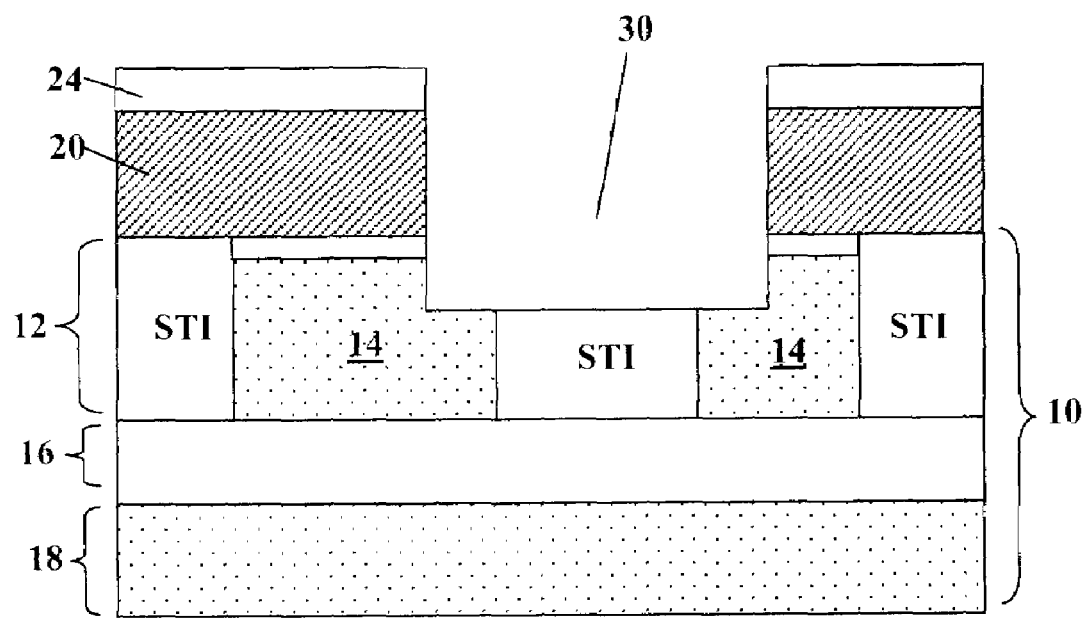
Figure 11B:
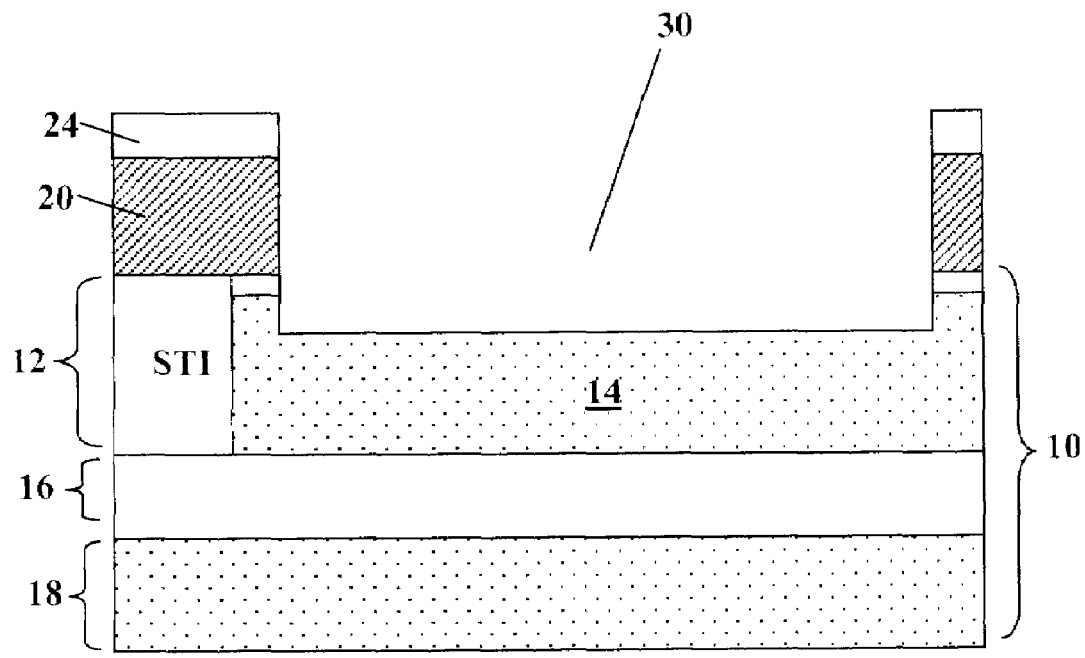

After etching has been completed, the patterned photoresist layer 26 is removed by resist stripping to expose an upper surface of the underlying dielectric hard mask layer 24, as shown in FIGS. 10 and 11A-11B.

Figure 12:
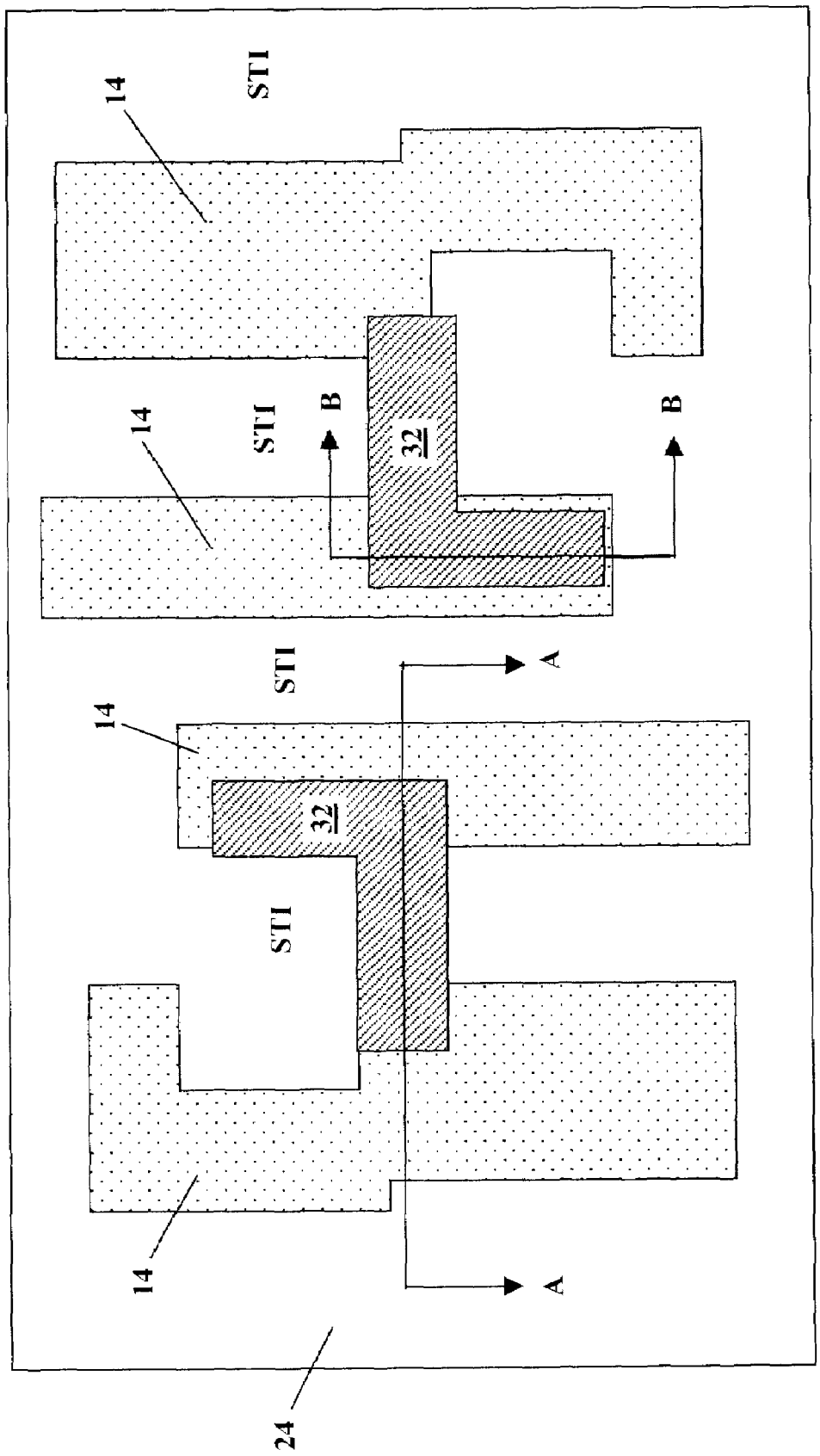
Figure 13A:
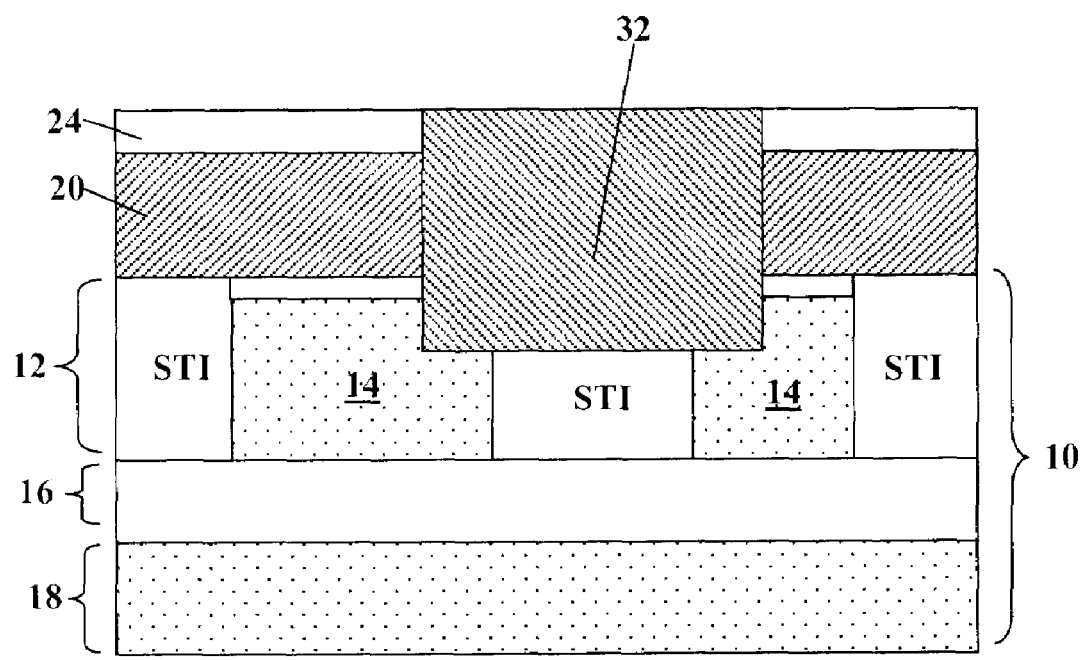
Figure 13B:
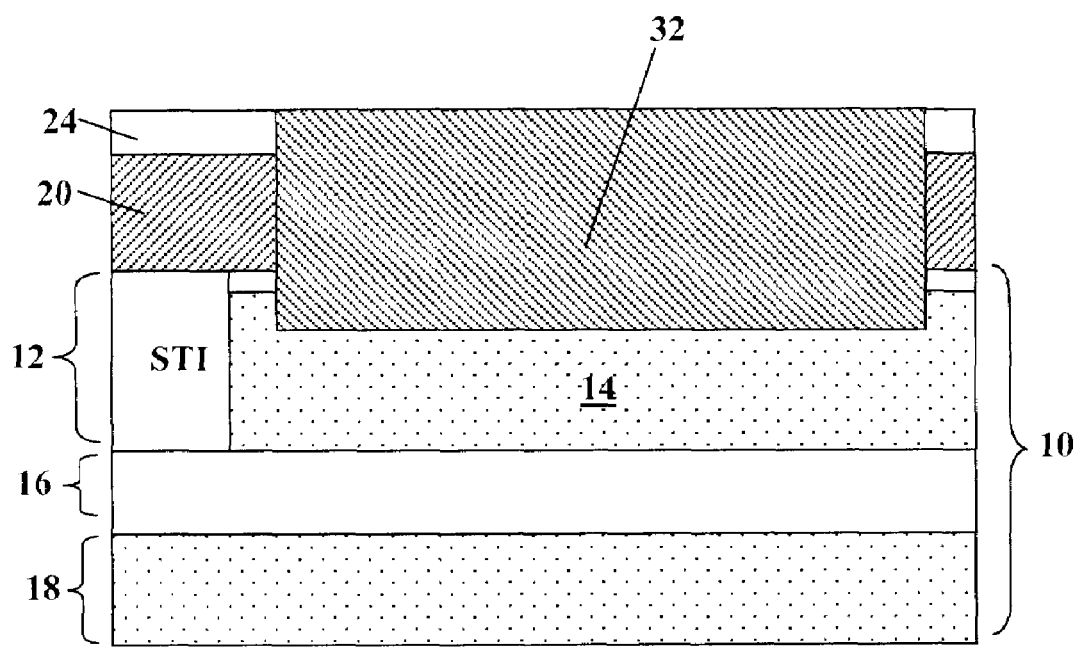

Next, a conductive material is filled into the trenches 30, followed by a planarization step to form the L-shaped conductive interconnects 32, as shown in FIGS. 12 and 13A-13B. Any suitable conductive material, such as, for example, doped semiconductors, metals, metal alloys, metal silicides, metal nitrides, etc., can be used to form the L-shaped interconnects 32. In a particularly preferred embodiment of the present invention, the L-shaped conductive interconnects 32 are formed of doped polysilicon. Conventional chemical mechanical polishing (CMP) techniques can be used for planarizing the deposited polysilicon material, and the dielectric hard mask layer 24 functions as a polishing stop layer during the CMP.

Figure 14:
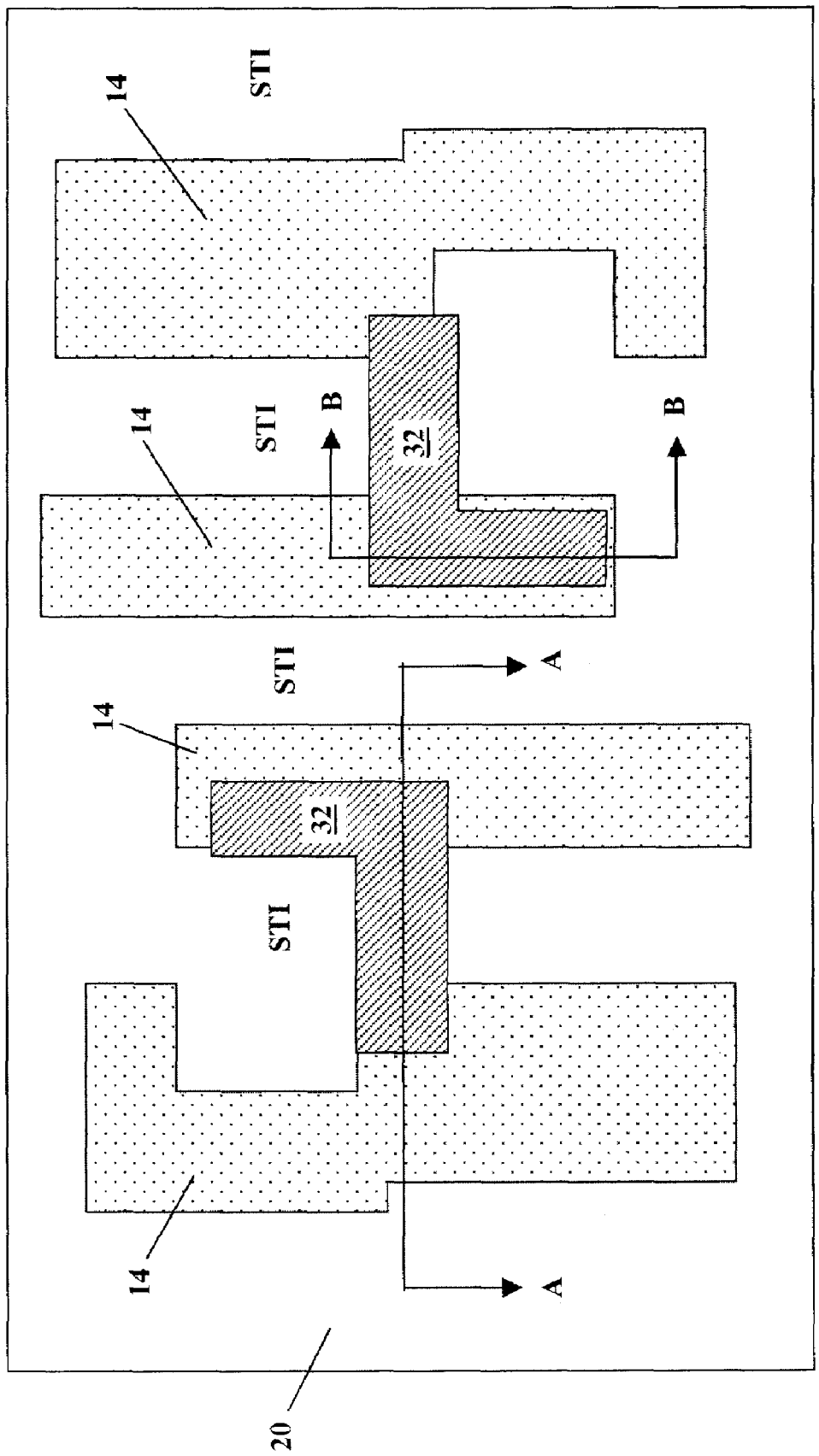
Figure 15A:
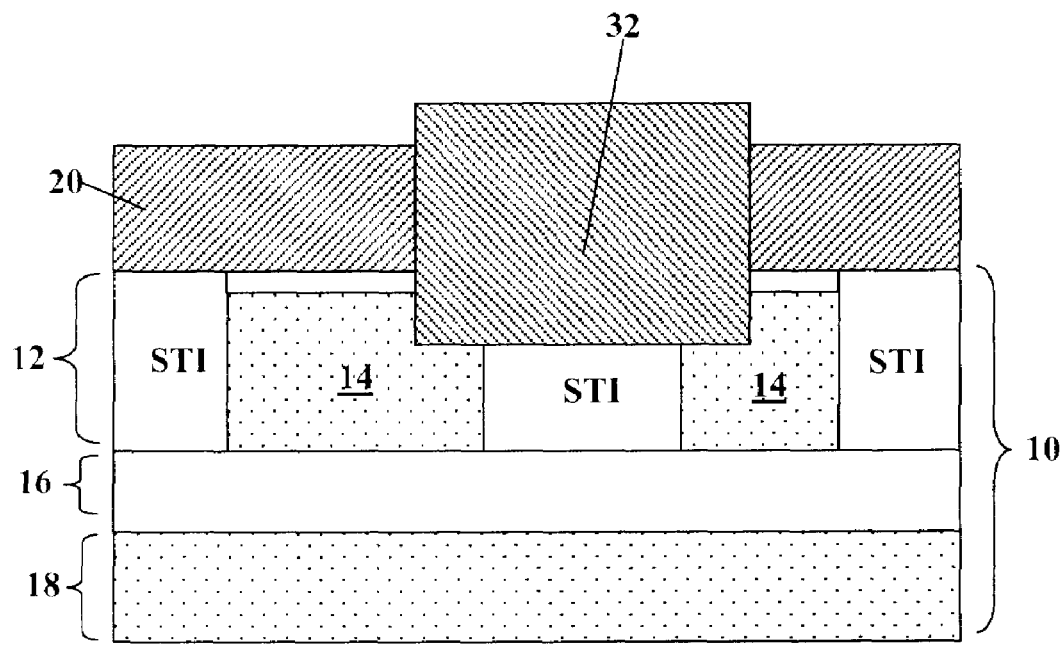
Figure 15B:
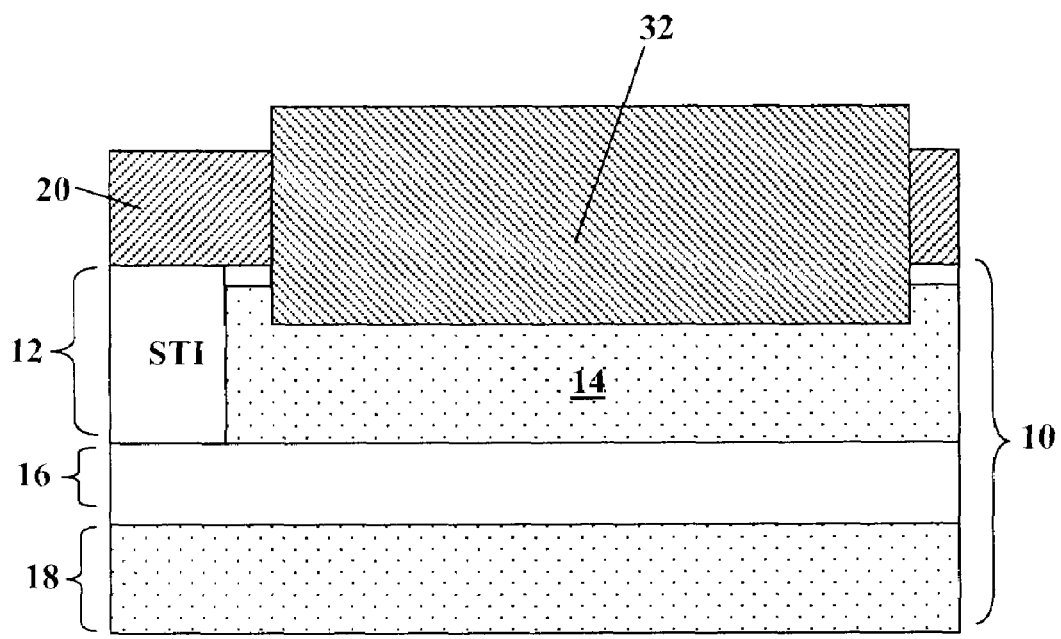
Figure 16:
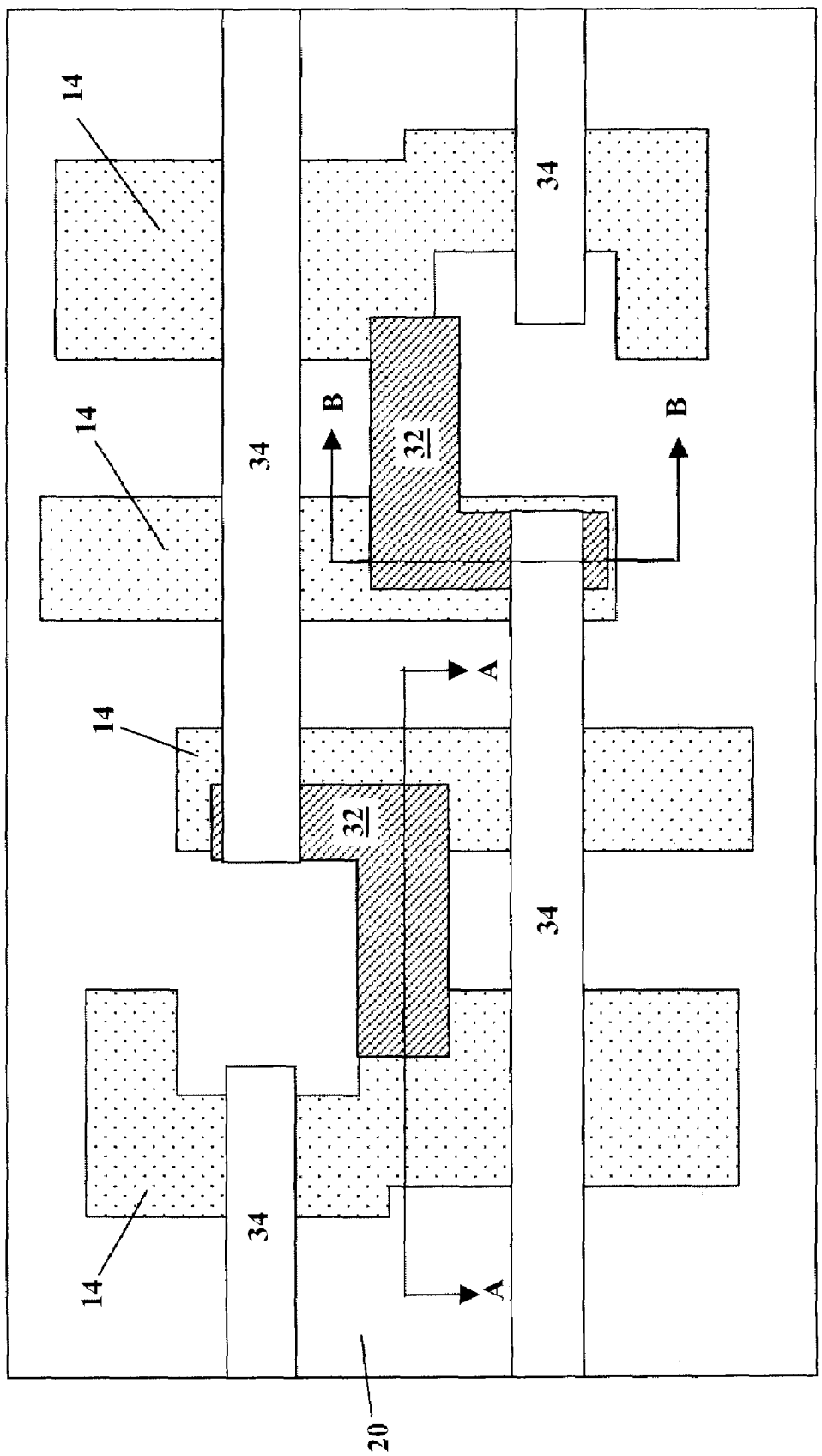
Figure 17A:
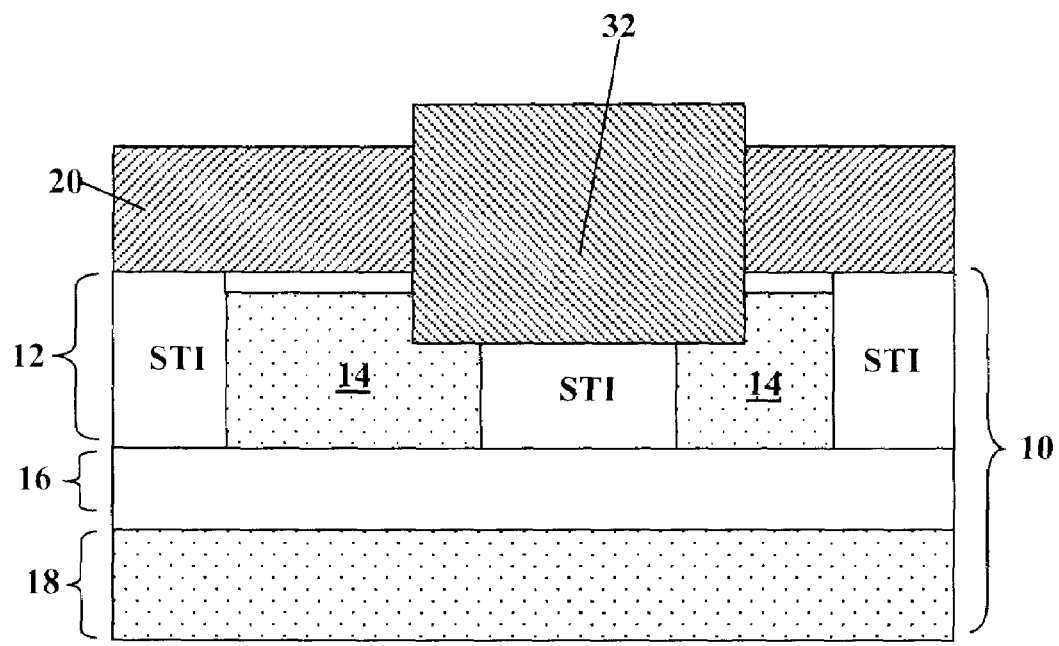
Figure 17B:
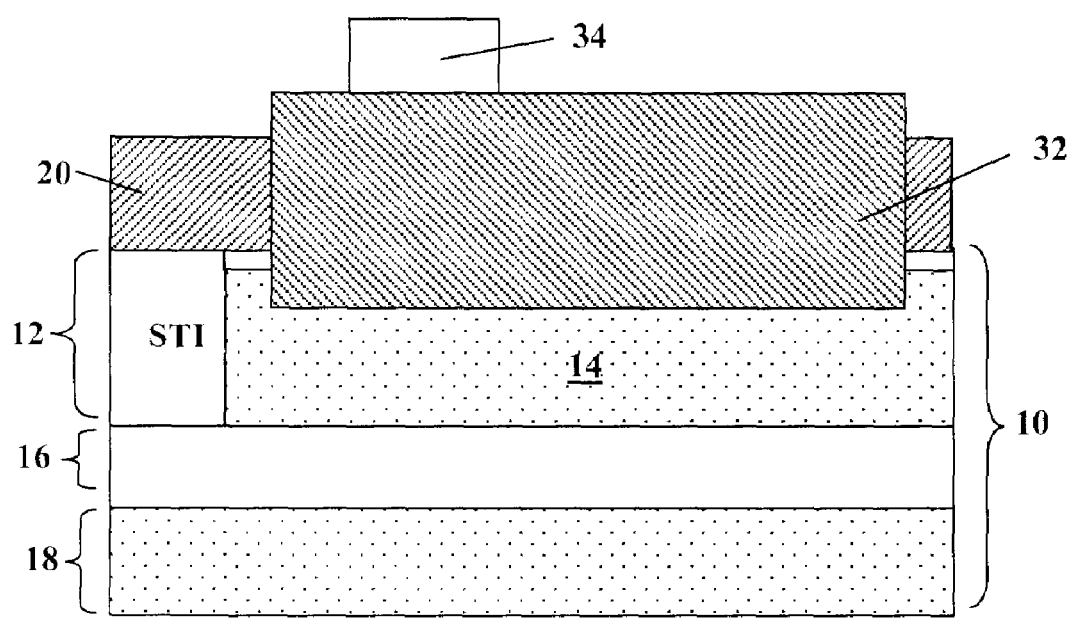

After formation of the L-shaped conductive interconnects 32, the dielectric hard mask layer 24 is removed to expose the underlying gate conductor layer 20, as shown in FIGS. 14 and 15A-15B. Next, a patterned photoresist layer 34 are deposited over the exposed gate conductor layer 20 and the L-shaped conductive interconnects 32, as shown in FIGS. 16 and 17A-17B. Such a patterned photoresist layer 34 defines gate structures for the SRAM cell to be formed.

Figure 18:
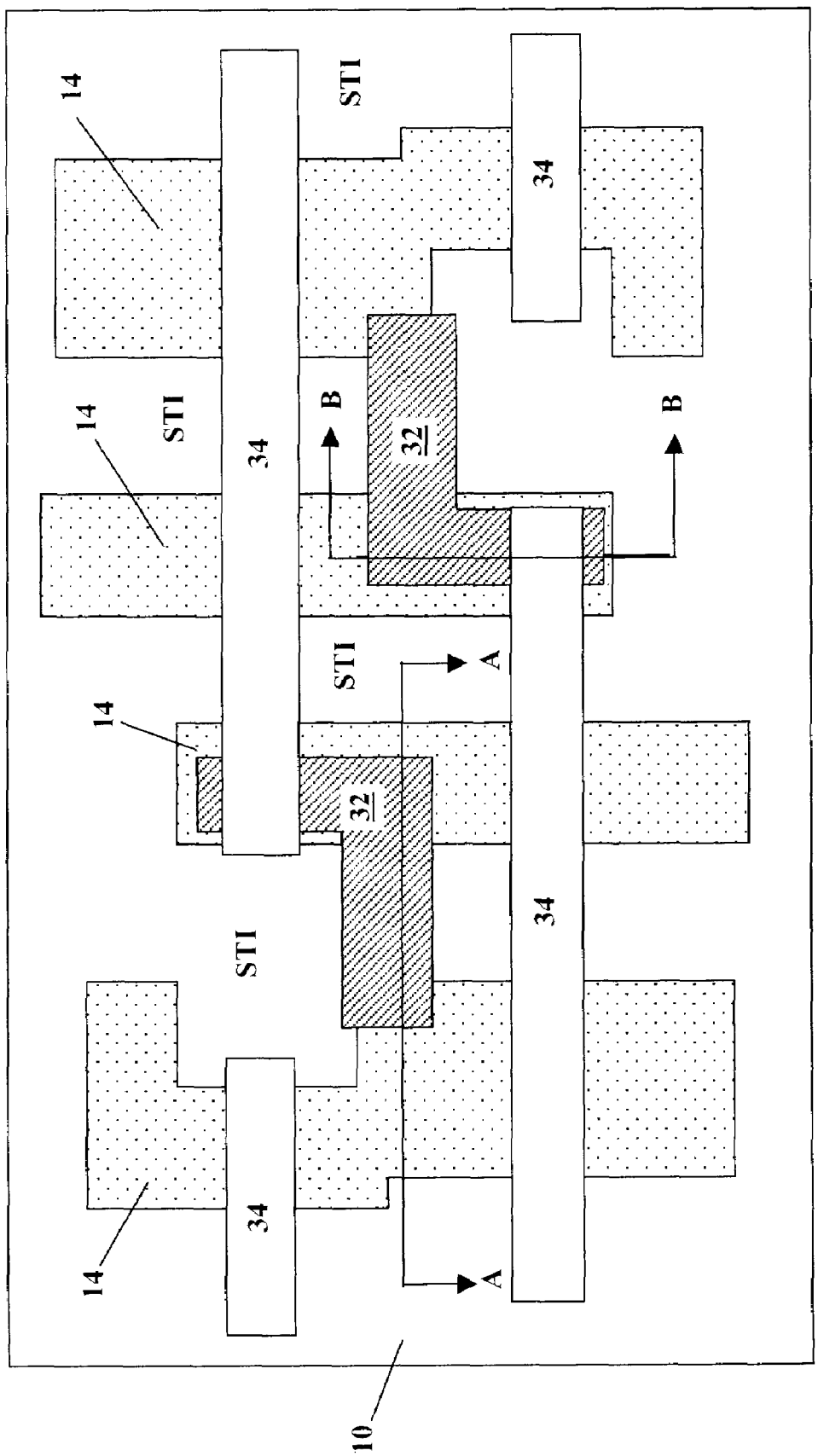
Figure 19A:
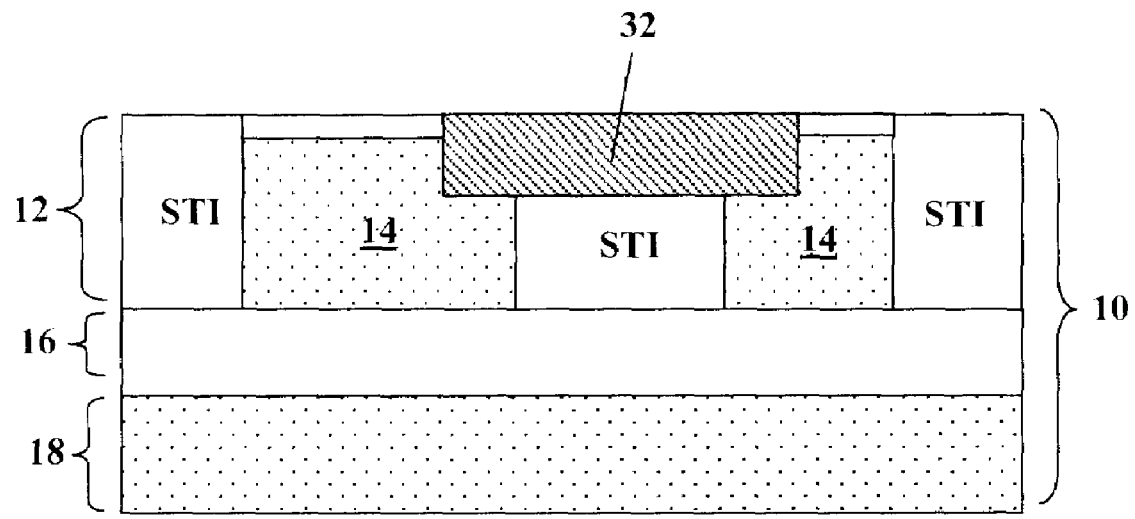
Figure 19B:
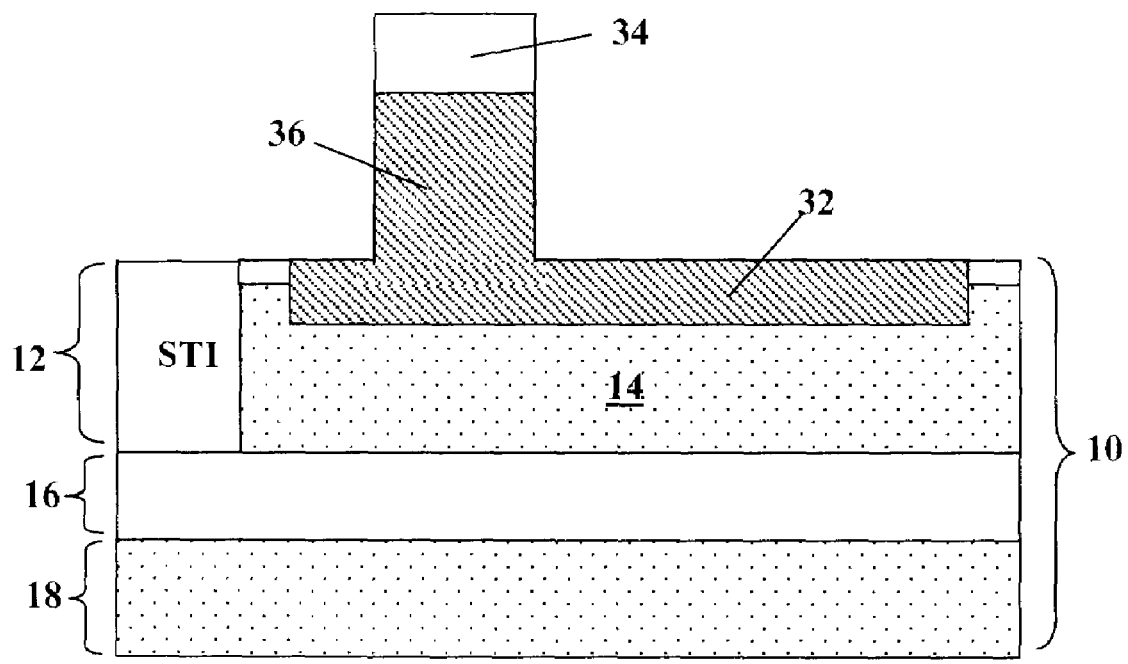

An etching step is then carried out using the patterned photoresist layer 34 as a mask to remove portions of the gate conductor layer 20 and the L-shaped conductive interconnects 32 not covered by the patterned photoresist layer 34. The etching is controlled in such a manner that it is terminated when the surface of the semiconductor substrate 10 becomes exposed, as shown in FIG. 18. Consequently, the exposed portions of the gate conductor layer 20 are completely removed, while the exposed portions of the L-shaped conductive interconnects 32 are recessed to the surface level of the semiconductor substrate 10, thereby forming interconnect structures 32 that are entirely embedded in the semiconductor substrate 10, as shown in FIGS. 18 and 19A. However, the covered portions of the gate conductor layer 20 and the L-shaped conductive interconnects 32 under the patterned photoresist layer 34 remain after the etching to form the gate structures 36 for the SRAM to be formed, as shown in FIG. 19B.

Figure 20:
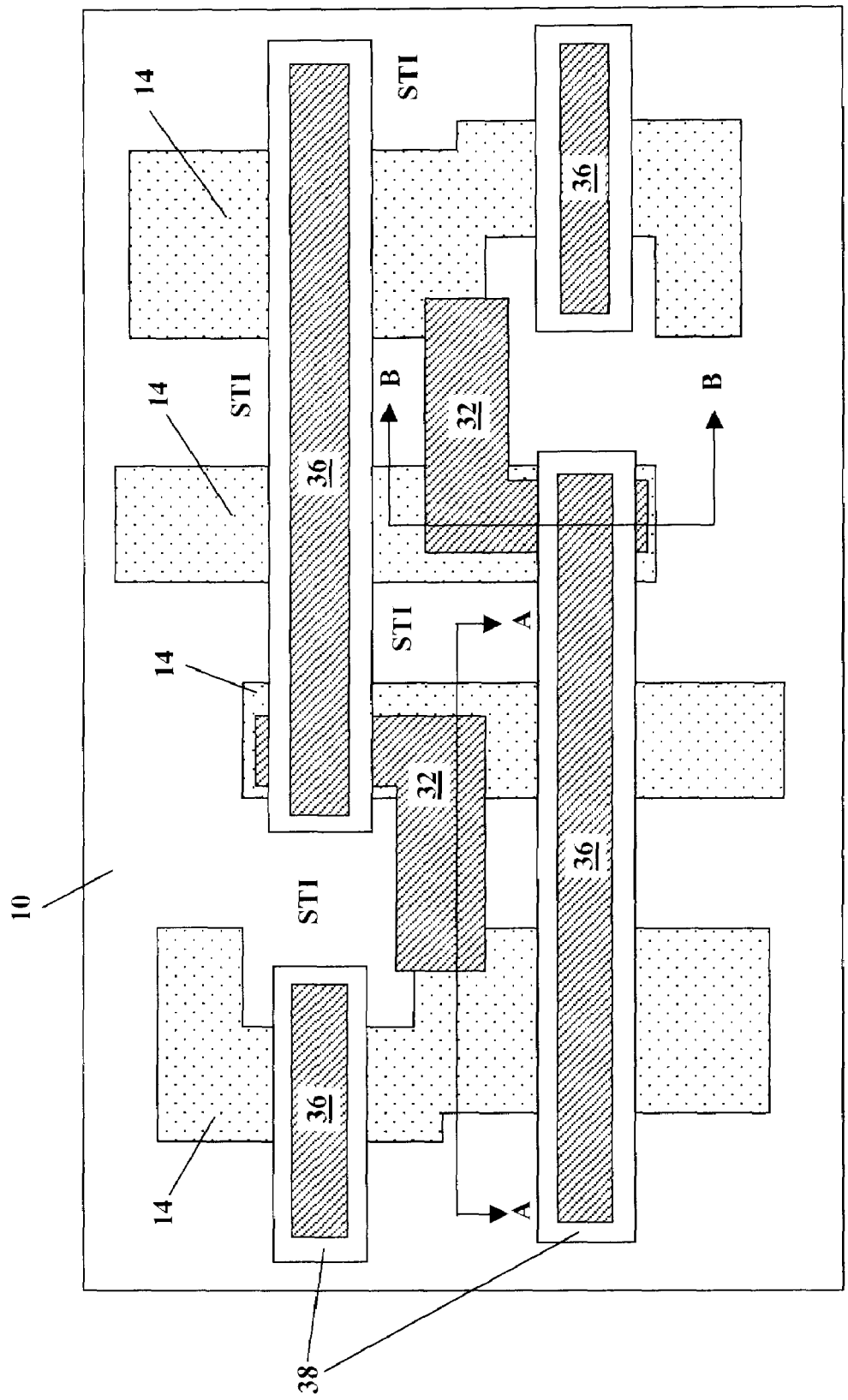
Figure 21A:
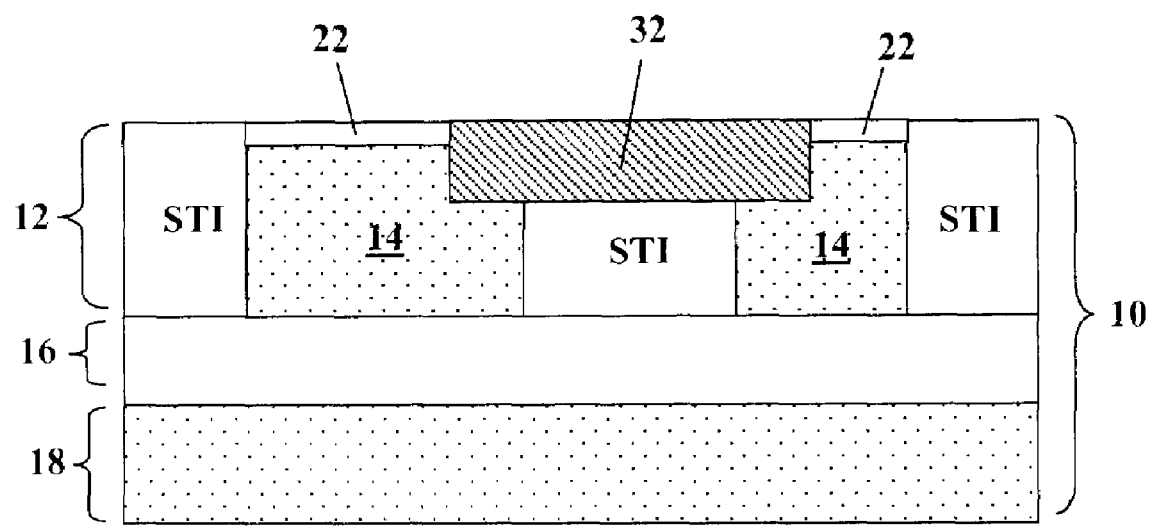
Figure 21B:
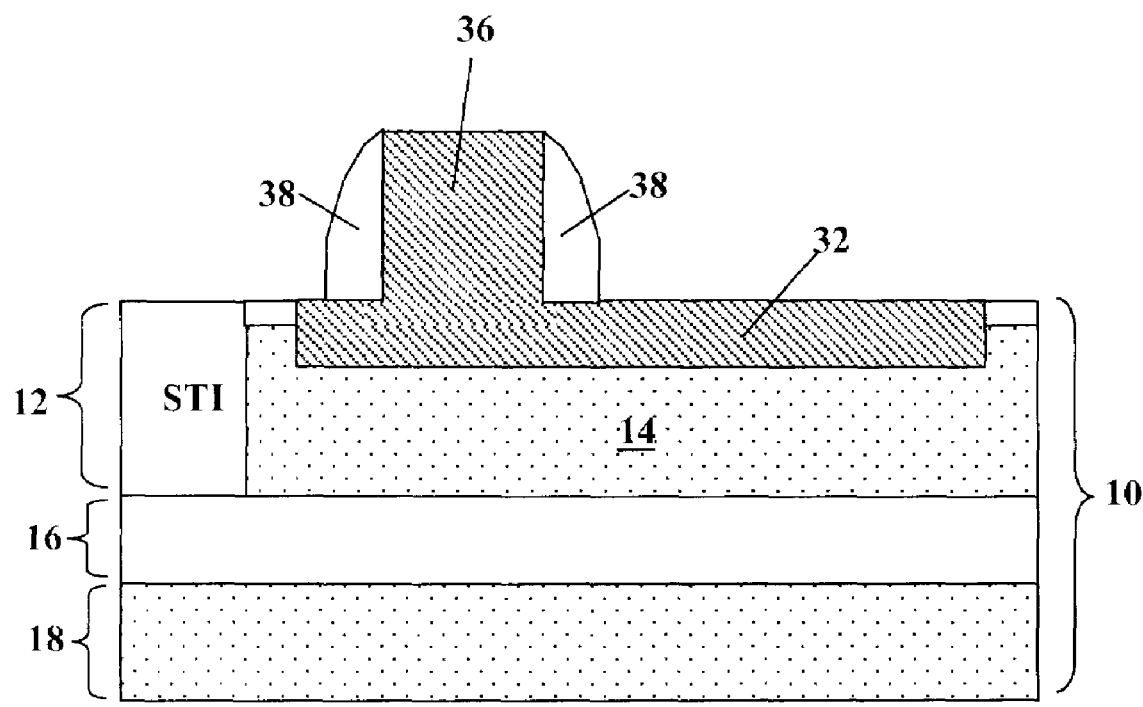

After etching, the patterned photoresist layer 34 is stripped to expose the gate structures 36 thereunder, followed by formation of dielectric sidewall spacers 38 around the gate structures 36, as shown in FIGS. 20 and 21A-21B.

Next, an insulator stripping process (not shown) is carried out to remove portions of the gate insulator layer 22 that are not covered by the gate structures 36 and the dielectric sidewall spacers 38, thereby exposing portions of the active device regions 14 thereunder.

Figure 22:
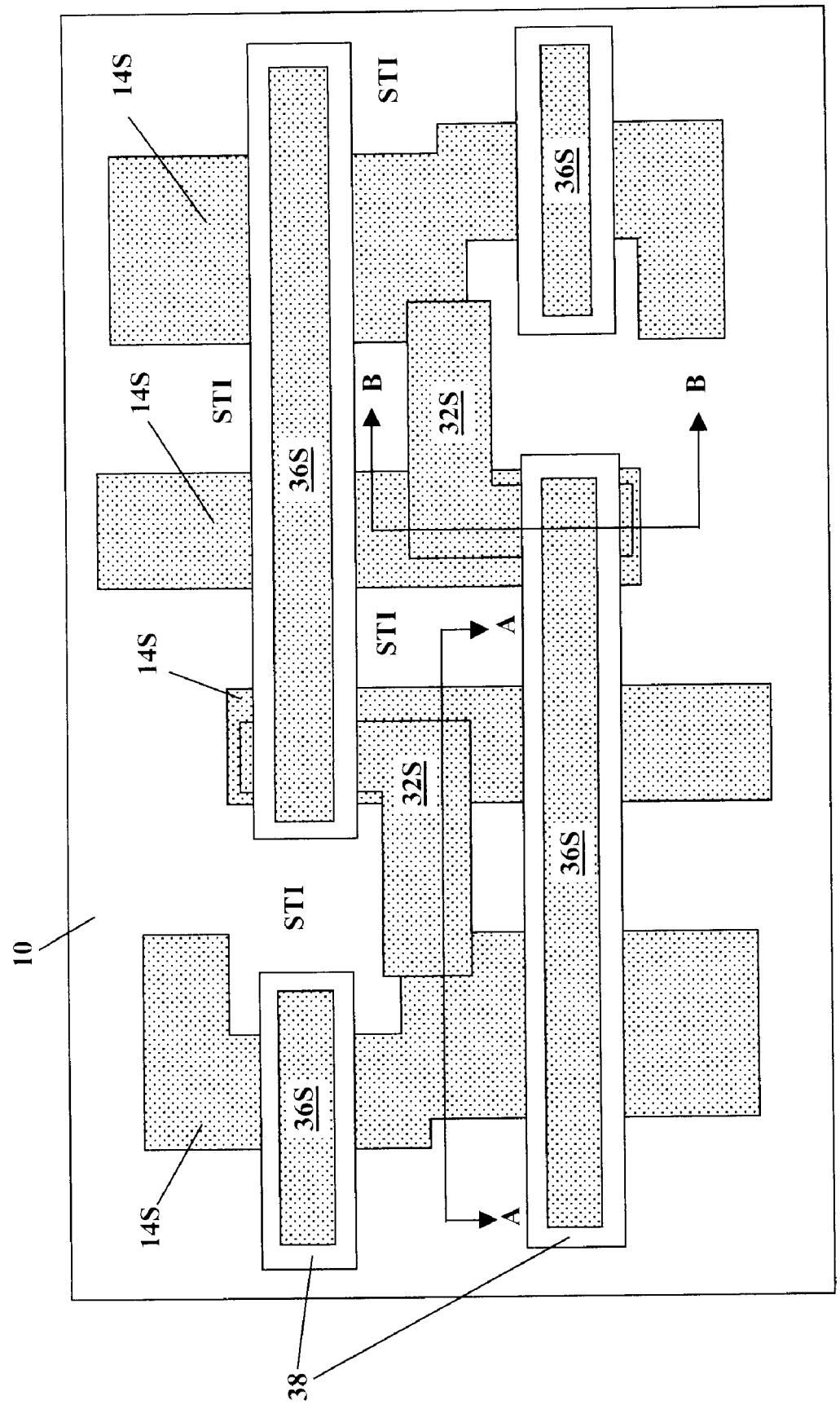
Figure 23A:
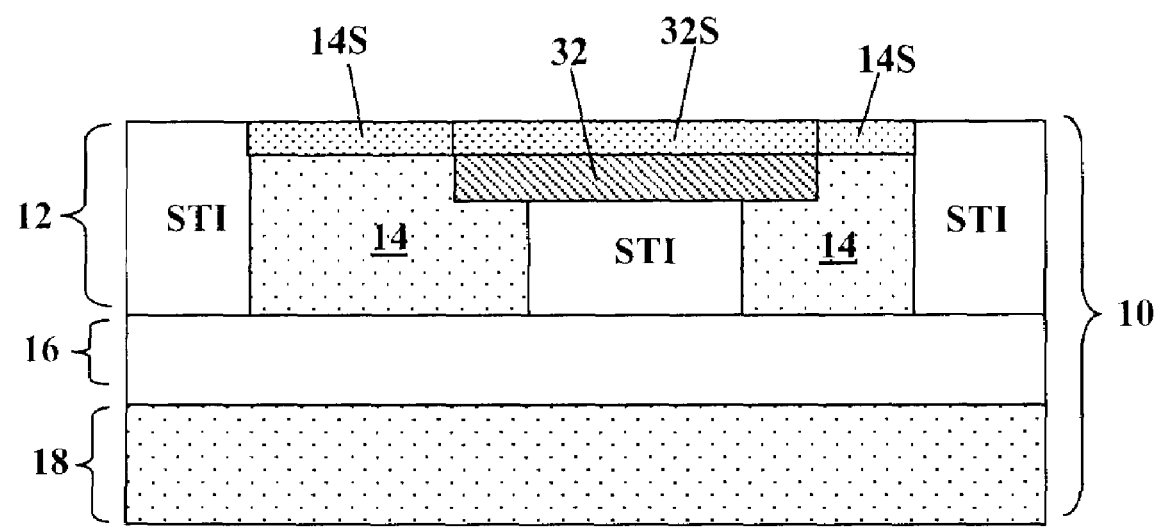
Figure 23B:
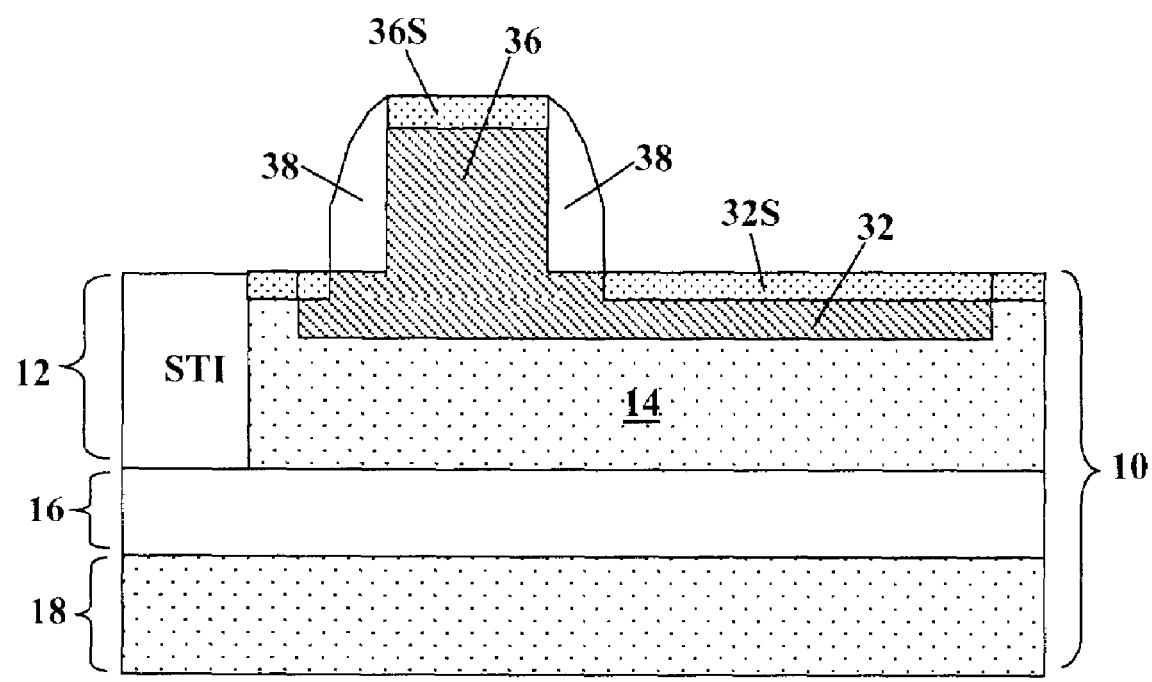

A subsequent salicidation step is then carried out over the entire structure to form: (1) surface metal silicide layers 14S over the exposed portions of the active device regions 14, (2) gate metal silicide layers 36S over the gate structures 36, and (3) contact silicides 32S over the exposed portions of the L-shaped conductive interconnects 32, as shown in FIGS. 22 and 23A-23B.

Additional CMOS processing steps well known in the art, such as source/drain doping, passivation, ILD deposition, etc., can be conducted to form a complete 6T-SRAM cell in the semiconductor substrate 10. Further, conventional back-end-of-line (BEOL) processing steps can be carried out to form multiple metal contacts (CAs), which provide excess to various components of the resulting 6T-SRAM cell, as shown in FIG. 24A.

Figure 24A:
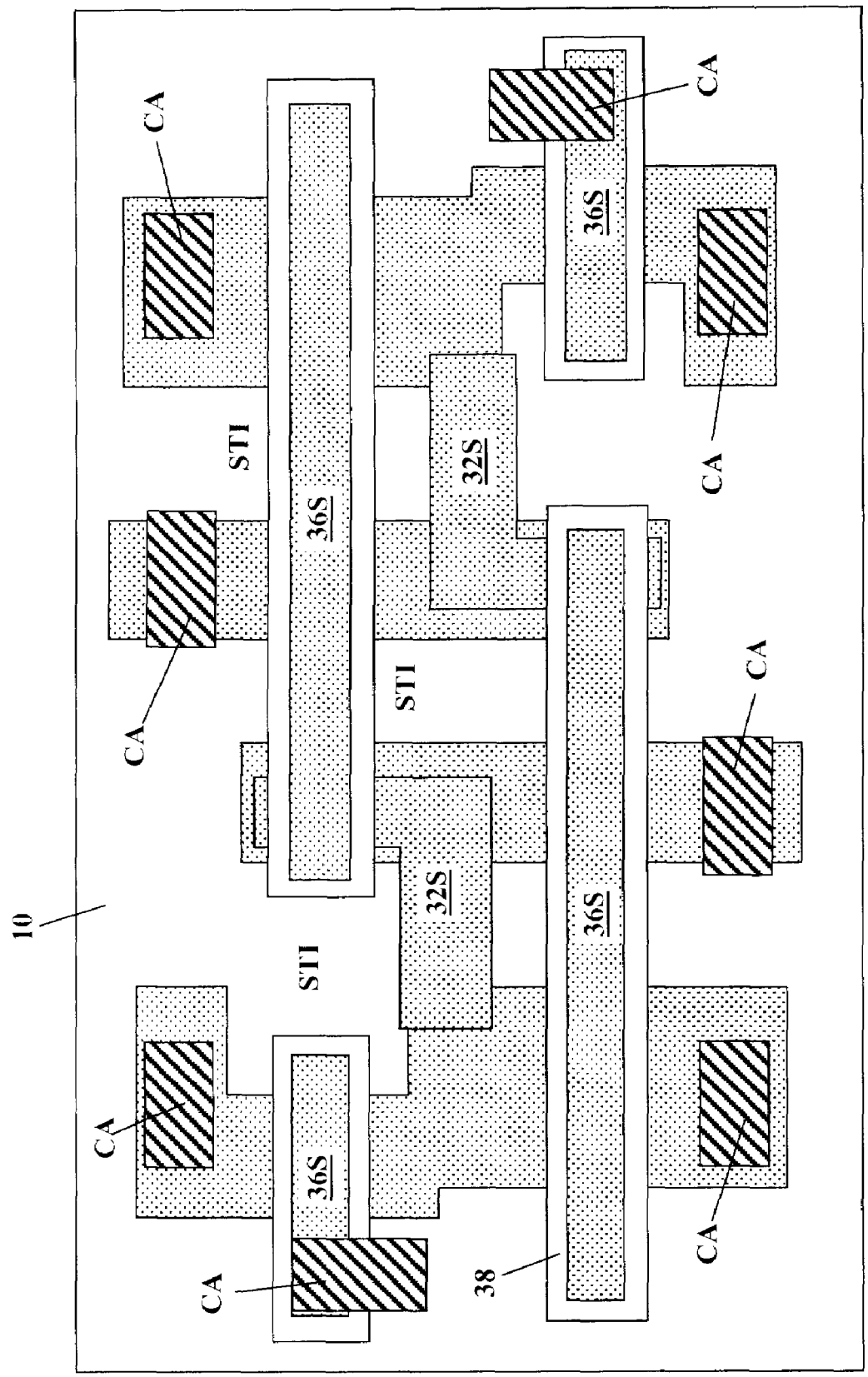
FIG. 24A is a top view of the resulting improved 6T-SRAM cell underneath the M1 level, as formed by the exemplary processing steps of FIGS. 2-23B.

Because the embedded L-shaped conductive interconnects 32 in the semiconductor substrate 10, already provide the necessary cross-connection between the pull-down and pull-up transistors located at different active device regions 14, only eight peripheral metal contacts (CAs) are needed for the SRAM cell at the contact level, as shown in FIG. 24A. Further, only eight external interconnect or nodes (ENs) are needed for the SRAM cell at the M1 level, as shown in FIG. 24B, while internal nodes (INs) or local interconnects are no longer necessary for such a SRAM cell.

Figure 24B:
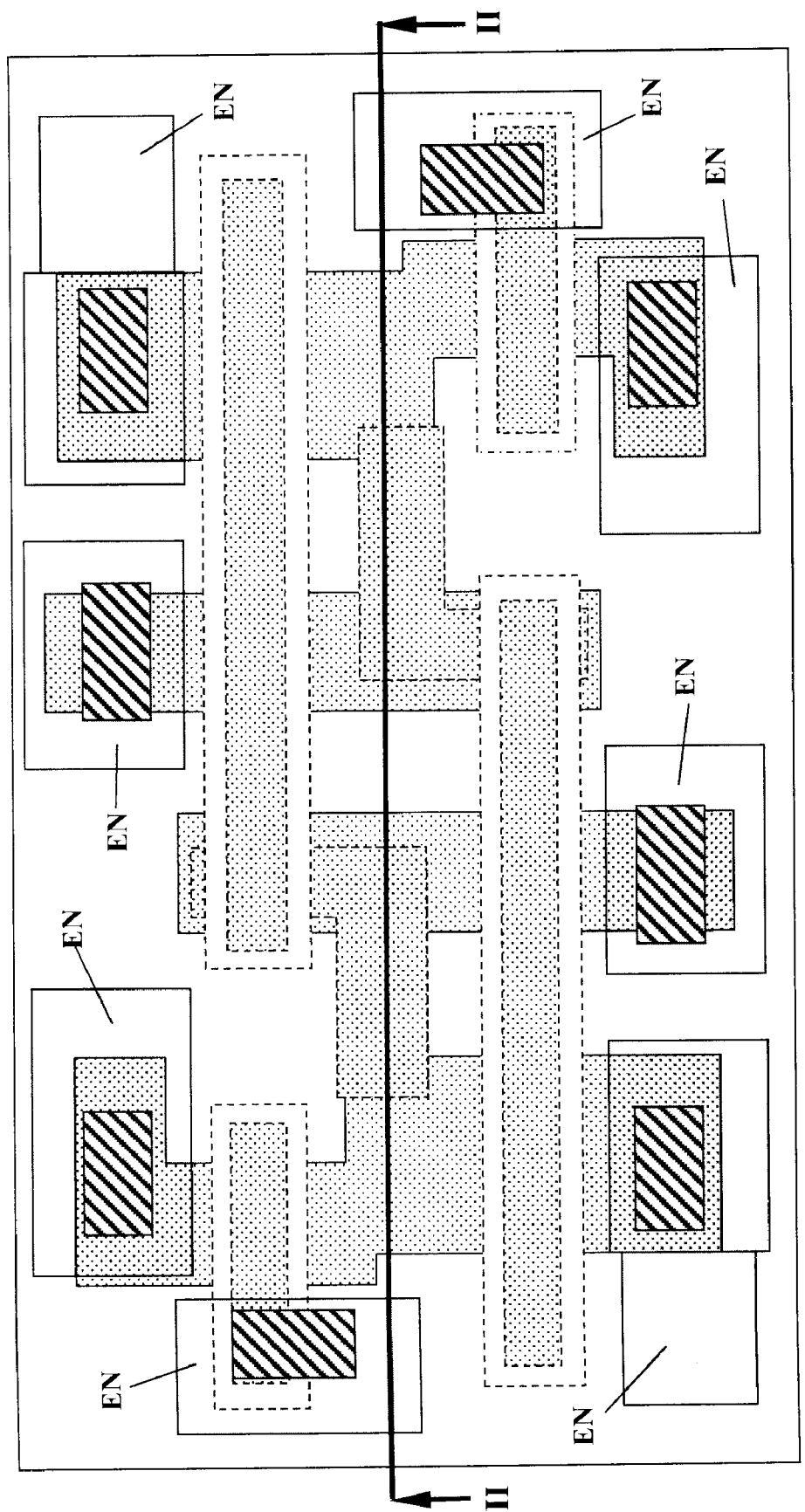
FIG. 24B is a top view of the improved 6T-SRAM cell of FIG. 24A at the M1 level.
Figure 24C:
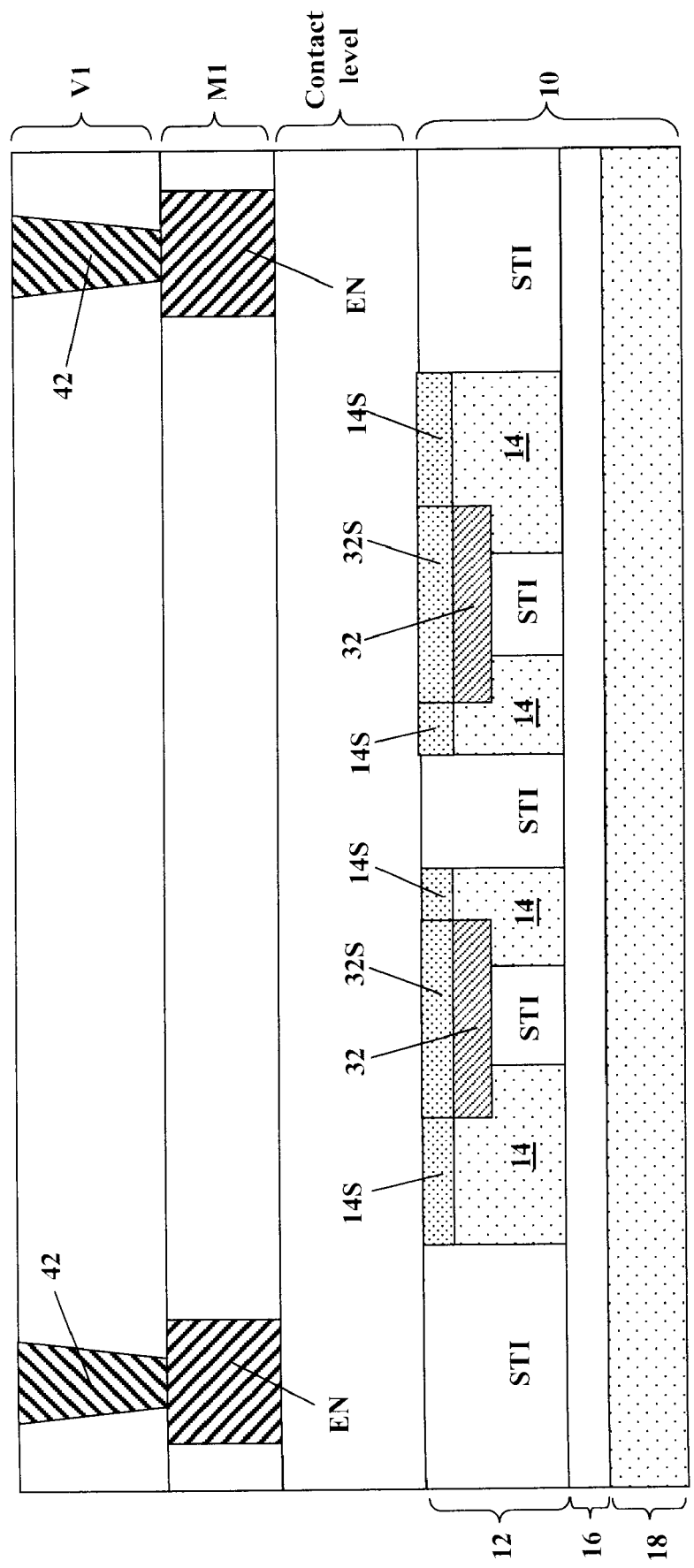
FIG. 24C is a cross-sectional view of the improved 6T-SRAM cell of FIGS. 24A-24B through the line II-II in FIG. 24B.

FIG. 24C shows the cross-sectional view of the improved SRAM cell of the present invention along the line II-II of FIG. 24B. The two ENs, which are located at the M1 level along the middle left and right borders of the improved SRAM cell, still electrically connect the underlying CAs (not shown) at the contact level with metal vias 42 in the first via level (V1). However, local interconnects at the M1 level and metal contacts at the contact level are no longer necessary for cross-connecting different active device regions, in light of the conductive interconnect structures 32 that are embedded in the semiconductor substrate 10. Therefore, the overall contact and interconnect densities at the contact level and the M1 level of the improved SRAM cell are significantly reduced, which allows further scaling of the SRAM layout area within the overlay limits of the currently available lithographic techniques.

Although the above description is provided primarily in terms of SRAM cell structures, for simplicity and illustration purposes only, the present invention is not limited to SRAM cells, but is broadly applicable to other semiconductor device structures that require cross-connections between adjacent active device regions, with or without modifications and variations, as readily determinable by a person ordinarily skilled in the art according to the principles described herein.

While the invention has been described herein with reference to specific embodiments, features and aspects, it will be recognized that the invention is not thus limited, but rather extends in utility to other modifications, variations, applications, and embodiments, and accordingly all such other modifications, variations, applications, and embodiments are to be regarded as being within the spirit and scope of the invention.

What is claimed is:

1. A method for forming a semiconductor device, comprising:
   forming first and second active device regions in a semiconductor substrate within an SRAM cell, wherein said first and second active device regions are isolated from each other by an isolation region therebetween; and
   forming a first conductive interconnect structure that is embedded in the isolation region to connect the first and second active device regions said forming the first conductive interconnect structure comprises etching into a portion of said first active device region, a portion of said second active device region and said isolation region to form a trench within the semiconductor substrate that extends beneath upper surfaces of the first and second device region and forming a conductive material within the trench.

2. The method of claim 1 wherein the SRAM cell comprises a first pull-down transistor formed in the first active device region and a first pull-up transistor formed in the second active device region, and wherein the first pull-down transistor and the first pull-up transistor are cross-connected by the first conductive interconnect structure.

3. The method of claim 2 wherein the SRAM cell further comprises a second pull-down transistor formed in a third active device region in the semiconductor substrate and a second pull-up transistor formed in a fourth active device region in the semiconductor substrate, and wherein a second conductive interconnect structure cross-connects the second pull-down transistor with the second pull-up transistor.

4. The method of claim 3 wherein the first and second conductive interconnect structures comprise one or more conductive materials selected from the group consisting of doped polysilicon, SiGe, NiSi, TaN, and mixtures thereof.

5. The method of claim 3 wherein the first and second conductive interconnect structures comprise doped polysilicon.

6. The method of claim 3 wherein the first and second conductive interconnect structures are formed by photolithographic patterning, etching, and polysilicon deposition.

7. The method of claim 3 wherein the first and second conductive interconnect structures are both L-shaped.

8. A method for forming a semiconductor device, comprising:
   forming a first active device region and a second active device region in a semiconductor substrate, wherein said first and second active device regions are isolated from each other by an isolation region therebetween;
   forming a first conductive interconnect structure comprising doped polysilicon and having an L-shape that is embedded in the isolation region to connect the first and second active device regions; said forming the first conductive interconnect structure comprises etching into a portion of said first active device region, a portion of said second active device region and said isolation region to form a trench within the semiconductor substrate that extends beneath upper surfaces of the first and second device region and forming doped polysilicon within the trench; and
   forming a SRAM cell having a first pull-down transistor formed in the first active device region and a first pull-up transistor formed in the second active device region, and wherein the first pull-down transistor and the first pull-up transistor are cross-connected by the first conductive interconnect structure.

* * * * *